(12) United States Patent
Fawcett et al.

(10) Patent No.: US 12,414,248 B2
(45) Date of Patent: Sep. 9, 2025

(54) ELECTRONIC LOCKS FOR SERVER RACKS

(71) Applicant: InVue Security Products Inc., Charlotte, NC (US)

(72) Inventors: Christopher J. Fawcett, Charlotte, NC (US); Gary A. Taylor, Fort Mill, SC (US); Jeffrey A. Grant, Matthews, NC (US); Ethan Evan Wood, Charlotte, NC (US); David N. Berglund, Indian Trail, NC (US)

(73) Assignee: InVue Security Products Inc., Charlotte, NC (US)

( * ) Notice: Subject to any disclaimer, the term of this patent is extended or adjusted under 35 U.S.C. 154(b) by 122 days.

(21) Appl. No.: 18/018,088

(22) PCT Filed: Jul. 27, 2021

(86) PCT No.: PCT/US2021/070993
§ 371 (c)(1),
(2) Date: Jan. 26, 2023

(87) PCT Pub. No.: WO2022/027021
PCT Pub. Date: Feb. 3, 2022

(65) Prior Publication Data
US 2023/0177902 A1 Jun. 8, 2023

Related U.S. Application Data

(60) Provisional application No. 63/059,280, filed on Jul. 31, 2020, provisional application No. 63/057,580, filed on Jul. 28, 2020.

(51) Int. Cl.
*H05K 5/02* (2006.01)
*G07C 9/00* (2020.01)
*H05K 7/14* (2006.01)

(52) U.S. Cl.
CPC ....... *H05K 5/0221* (2013.01); *G07C 9/00309* (2013.01); *G07C 9/00857* (2013.01);
(Continued)

(58) Field of Classification Search
None
See application file for complete search history.

(56) References Cited

U.S. PATENT DOCUMENTS 7,681,424 B2  3/2010  Antonucci
9,708,833 B2  7/2017  Scheffler et al.
(Continued)

OTHER PUBLICATIONS

European Patent Office; Supplementary European Search Report for European Application No. 21 84 8753; Dated: Jul. 9, 2024.
(Continued)

*Primary Examiner* — Thomas S McCormack
(74) *Attorney, Agent, or Firm* — InVue Security Products Inc.

(57) ABSTRACT

Embodiments of the present invention are directed to systems and methods for preventing unauthorized access to server racks. In one example, a system includes an electronic key and an electronic lock configured to be attached to the server rack. The electronic lock is configured to communicate with the electronic key for determining whether the electronic key is authorized to unlock or lock the lock. The electronic lock includes a handle configured to be disengaged from the electronic lock when the electronic key is authorized, and the handle is configured to be actuated to unlock the lock for accessing the server rack when the handle is disengaged from the electronic lock. The electronic lock is configured to re-lock only when the handle is engaged with the electronic lock.

19 Claims, 28 Drawing Sheets

(52) U.S. Cl.
CPC . *H05K 7/1495* (2013.01); *G07C 2009/00388* (2013.01); *G07C 2009/00579* (2013.01); *G07C 2009/00634* (2013.01)

(56) References Cited

U.S. PATENT DOCUMENTS

| | | |
|---|---|---|
| 2002/0189307 A1 | 12/2002 | Gokcebay et al. |
| 2004/0160305 A1 | 8/2004 | Remenih et al. |
| 2009/0025440 A1 | 1/2009 | Downing |
| 2009/0273440 A1 | 11/2009 | Marschalek et al. |
| 2011/0084799 A1 | 4/2011 | Ficko |
| 2011/0254661 A1 | 10/2011 | Fawcett et al. |
| 2012/0047972 A1* | 3/2012 | Grant ............. E05B 47/06 70/77 |
| 2013/0081434 A1 | 4/2013 | Grant et al. |
| 2014/0029198 A1 | 1/2014 | Lozon et al. |
| 2014/0084764 A1* | 3/2014 | Doglio ............. H05K 7/1489 403/322.4 |
| 2015/0156912 A1 | 6/2015 | Liang et al. |
| 2015/0228138 A1 | 8/2015 | Simmonds |
| 2016/0078702 A1 | 3/2016 | Grant et al. |
| 2018/0106073 A1* | 4/2018 | Cahill ............. E05B 39/04 |

OTHER PUBLICATIONS

Cyberlock Catalog; "Cyberlock—Secure, track and Report on every one of your locks, anywhere in the world"; pp. 1-16; Dated Mar. 22, 2023.
Wikipedia; "Radio-frequency identification"; Retrieved from the internet, URL: https://en.widipedia.org/w/index.php?title=Radio-frequency_identification&oldid=854378551; Dated Aug. 10, 2018.
The International Search Report from corresponding International Application No. PCT/US2021/070993, dated Jul. 27, 2021.

\* cited by examiner

ELECTRONIC LOCKS FOR SERVER RACKS

CROSS REFERENCE TO RELATED APPLICATIONS

This application claims the benefit of priority to and is a 371 U.S. national phase entry of International Application No. PCT/US2021/70993, filed on Jul. 27, 2021, which is a non-provisional of and claims the benefit of priority to U.S. Provisional Application No. 63/057,580, filed on Jul. 28, 2020 and U.S. Provisional. No. 63/059,280, filed on Jul. 31, 2020, the entire disclosures of which are incorporated herein by reference.

FIELD OF THE INVENTION

Embodiments of the present invention relates generally to electronic locks, systems, and methods for server racks.

BACKGROUND OF THE INVENTION

Server racks are generally protected in the market by standard mechanical keys and/or combination codes which have issues such as broken keys, ease of copying, difficulty in managing access to multiple locks with multiple keys and multiple users, and no traceability to show who accessed the racks and when. Electronic locks address some of the issues with mechanical keys but typically require cumbersome wiring and infrastructure overhead in order to provide power and control for each lock. In addition, in order to electronically track any user interactions with electronic locks, an extensive network of data cables and hubs also need to be installed.

BRIEF SUMMARY

Embodiments of the present invention are directed towards a security system for a server rack comprising an electronic key and an electronic lock configured to be attached to the server rack. The electronic lock is configured to communicate with the electronic key for determining whether the electronic key is authorized to unlock or lock the electronic lock. The electronic lock comprises a handle configured to be disengaged from the electronic lock when the electronic key is authorized, wherein the handle is configured to be actuated to unlock the lock for accessing the server rack when the handle is disengaged from the electronic lock, and wherein the electronic lock is configured to re-lock only when the handle is engaged with the electronic lock.

In another embodiment, a security system for a server rack comprises a server rack comprising a cabinet and a door. The security system includes an electronic key and an electronic lock configured to be attached to the server rack. The electronic lock is configured to communicate with the electronic key for determining whether the electronic key is authorized to unlock or lock the electronic lock. In some aspects, the electronic lock comprises a handle configured to be disengaged from the electronic lock when the electronic key is authorized, wherein the handle is configured to be actuated to unlock the lock for unlocking the door from the cabinet when the handle is disengaged from the electronic lock, and wherein the electronic lock is configured to re-lock only when the handle is engaged with the electronic lock. In other aspects, the electronic key comprises an internal power source, and wherein the electronic lock is configured to be operated using electrical power transferred from the internal power source.

In another embodiment, a security system for a server rack is provided and includes an electronic key and an electronic lock configured to be attached to the server rack. The electronic lock is configured to communicate with the electronic key for determining whether the electronic key is authorized to unlock or lock the electronic lock. Moreover, the electronic key comprises an internal power source, and wherein the electronic lock is configured to be operated using electrical power transferred from the internal power source.

In another embodiment, a security system for securing items from theft is provided. The security system comprises an electronic key and an electronic lock configured to communicate with the electronic key for determining whether the electronic key is authorized to unlock or lock the electronic lock. The electronic lock comprises a handle configured to be disengaged from the electronic lock when the electronic key is authorized, wherein the handle is configured to be actuated to unlock the lock for accessing the items when the handle is disengaged from the electronic lock, and wherein the electronic lock is configured to re-lock only when the handle is engaged with the electronic lock.

In another embodiment, a method for protecting a server rack from unauthorized access is provided. The method comprises attaching an electronic lock to a server rack and actuating an electronic key for communicating with the electronic lock to determine whether the electronic key is authorized to unlock or lock the electronic lock. The electronic lock comprises a handle configured to be disengaged from the electronic lock when the electronic key is authorized. The method further includes actuating the handle to unlock the lock for accessing the server rack when the handle is disengaged from the electronic lock and actuating the handle to engage the electronic lock. In addition, the method includes actuating the electronic key to re-lock the electronic lock when the handle is engaged with the electronic lock.

In another embodiment, a method for protecting a server rack from unauthorized access is provided. The method comprises communicating between an electronic key and an electronic lock to determine whether the electronic key is authorized to unlock or lock the electronic lock. The method further includes transferring electrical power from the internal power source of the electronic key to the security device, wherein the electronic lock is configured to be operated using electrical power transferred from the internal power source if the electronic key is authorized.

DETAILED DESCRIPTION OF EMBODIMENTS OF THE INVENTION

Figure 1A:
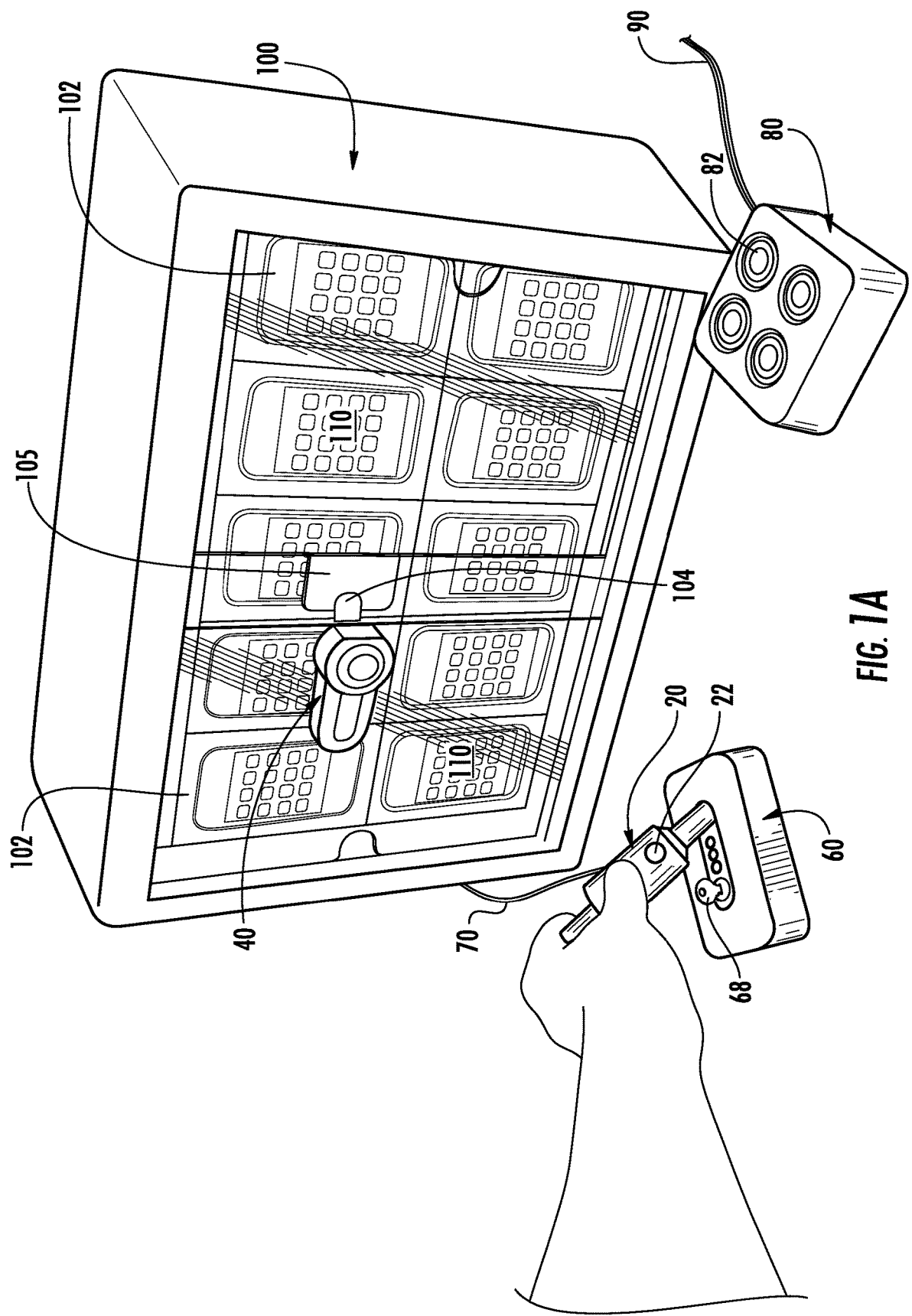
FIG. 1A shows an embodiment of a security system and method including a programmable electronic key, a security device, a programming station and a charging station according to an embodiment of the invention.

Referring now to the accompanying drawing figures wherein like reference numerals denote like elements throughout the various views, one or more embodiments of a security system and method for server racks are shown. In the embodiments shown and described herein, the system and method include a programmable electronic key, indicated generally at 20, 120 and a security device, indicated generally at 40, 140, 240, 340, 440. Security devices 40, 140, 240, 340, 440 suitable for use with the programmable electronic keys 20, 120 include, but are not limited to, server racks for storing various types and quantities of computer and/or network equipment, such as for example, servers, computers, hard drives, media storage, routers, hubs, network switches, etc. The server rack may define an enclosure that is configured to secure various computer and/or network equipment that is only configured to be accessed by authorized personnel, such as described in the following embodiments. Of course, embodiments of the present invention are applicable to any number of security devices 40, 140, 240, 340, 440 for securing various items from theft and are therefore not intended to be limited to use with server racks or server cabinets.

An embodiment of a system and method according to the invention is illustrated in FIGS. 1A-9B. The embodiment of the security system and method depicted comprises a programmable electronic key 20, which is also referred to herein as a security key, and a security device 40 that is configured to be operated by the key. The system and method may further comprise an optional programming or authorization station, indicated generally at 60, that is operable for programming the key 20 with a security code, which is also referred to herein as a Security Disarm Code (SDC). The term SDC is not intended to be limiting, as it may be any code configured to be used to determine whether the key 20 is authorized to control the security device 40. In addition to programming station 60, the system and method may further comprise an optional charging station, indicated generally at 80, that is operable for initially charging and/or subsequently recharging a power source disposed within the key 20. For example, security key 20 and security device 40 may each be programmed with the same SDC into a respective permanent memory. The security key 20 may be provisioned with a single-use (e.g., non-rechargeable) power source, such as a conventional or extended-life battery, or alternatively, the key may be provisioned with a multiple-use (e.g., rechargeable) power source, such as a conventional capacitor or rechargeable battery. In either instance, the power source may be permanent, semi-permanent (e.g., replaceable), or rechargeable, as desired. In the latter instance, charging station 80 is provided to initially charge and/or to subsequently recharge the power source provided within the security key 20. Furthermore, key 20 and/or security device 40 may be provided with only a transient memory, such that the SDC must be programmed (or reprogrammed) at predetermined time intervals. In this instance, programming station 60 is provided to initially program and/or to subsequently reprogram the SDC into the key 20. As will be described, key 20 is operable to initially program and/or to subsequently reprogram the security device 40 with the SDC. Key 20 is then further operable to operate the security device 40 using power transferred to the security device and/or data communicated with the device, as will be described.

In one embodiment of the system and method illustrated in FIGS. 1A-9B, programmable electronic key 20 is configured to be programmed with a unique SDC by the programming station 60. A programming station 60 suitable for use with the present invention is shown and described in detail in the commonly owned U.S. Pat. No. 7,737,844 entitled PROGRAMMING STATION FOR A SECURITY SYSTEM FOR PROTECTING MERCHANDISE, the disclosure of which is incorporated herein by reference in its entirety. As illustrated in FIG. 1A and best shown in enlarged FIG. 1B, the key 20 is presented to the programming station 60 and communication therebetween is initiated, for example by pressing a control button 22 provided on the exterior of the key. Communication between the programming station 60 and the key may be accomplished directly, for example, by one or more electrical contacts, or indirectly, for example by wireless communication. Any form of wireless communication capable of transferring data between the programming station 60 and key 20 is also possible, including without limitation optical transmission, acoustic transmission, or magnetic induction. In the, embodiments shown and described herein, communication between programming station 60 and key 20 is accomplished by wireless optical transmission, and more particularly, by cooperating infrared (IR) transceivers provided in the programming station and the key. The components and method of IR communication between programming station 60 and key 20 is described in greater detail in the aforementioned U.S. Pat. No. 7,737,844, and accordingly, will not be repeated here. For the purpose of describing the present invention, it is sufficient that the programming station comprises at least a logic control circuit for generating or being provided with a SDC, a memory for storing the SDC, and a communications system suitable for interacting with the programmable electronic key 20 in the manner described herein to program the key with the SDC.

Figure 1B:
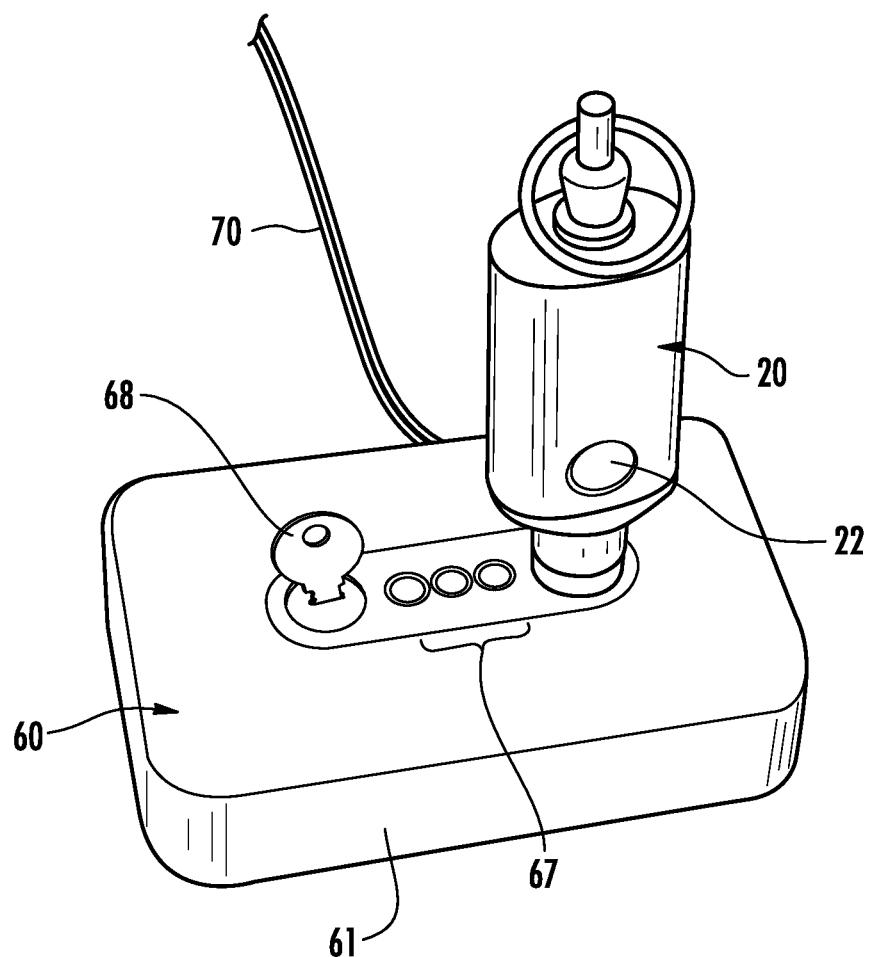
FIG. 1B is an enlarged view showing the programmable electronic key of FIG. 1A positioned on the programming station of FIG. 1A to be programmed with a security code.

As shown in FIG. 1B, programming station 60 comprises a housing 61 configured to contain the logic control circuit that generates the SDC, the memory that stores the SDC, and a communications system, namely an optical transceiver, for wirelessly communicating the SDC to a cooperating optical transceiver disposed within the key 20. In use, the logic control circuit generates the SDC, which may be a predetermined (e.g., "factory preset") security code, or which may be a security code that is randomly generated by the logic control circuit of the programming station 60 at the time a first key 20 is presented to the station for programming In the latter instance, the logic control circuit further comprises a random number generator for producing the unique SDC. A series of visual indicators, for example light-emitting diodes (LEDs) 67 may be provided on the exterior of the housing 61 for indicating the operating status of the programming station. Use of the programming station 60 may further require authorization, such as with a mechanical lock mechanism, for example, a conventional key and tumbler lock 68, for preventing use of the programming station by an unauthorized person. Alternatively, the programming station 60 may require various other forms of authentication, such as a pin code, biometric identification, facial recognition, etc. in order to activate the key 20 or otherwise gain access to the key. As shown herein, the programming station 60 may be operatively connected to an external power source by a power cord 70 having at least one conductor. Alternatively, the programming station 60 may comprise an internal power source, for example an extended-life replaceable battery or a rechargeable battery, for providing power to the logic control circuit and the LEDs 67.

In one example embodiment, the logic control circuit of the programming station 60 performs an electronic exchange of data with a logic control circuit of the key 20, commonly referred to as a "handshake communication protocol." The handshake communication protocol determines whether the key is an authorized key that has not been programmed previously, or is an authorized key that is being presented to the programming station a subsequent time to refresh the SDC. In the event that the handshake communication protocol fails, the programming station 60 will not provide the SDC to the unauthorized device attempting to obtain the SDC, for example an infrared reader on a counterfeit key. When the handshake communication protocol succeeds, programming station 60 permits the SDC randomly generated by the logic control circuit and/or stored in the memory of the station to be transmitted by the optical transceiver to the cooperating optical transceiver disposed within the key 20. As will be readily apparent to those skilled in the art, the SDC may be transmitted from the programming station 60 to the security key 20 alternatively by any other suitable means, including without limitation, electrical contacts or electromechanical, electromagnetic or magnetic conductors, as desired.

Figure 2:
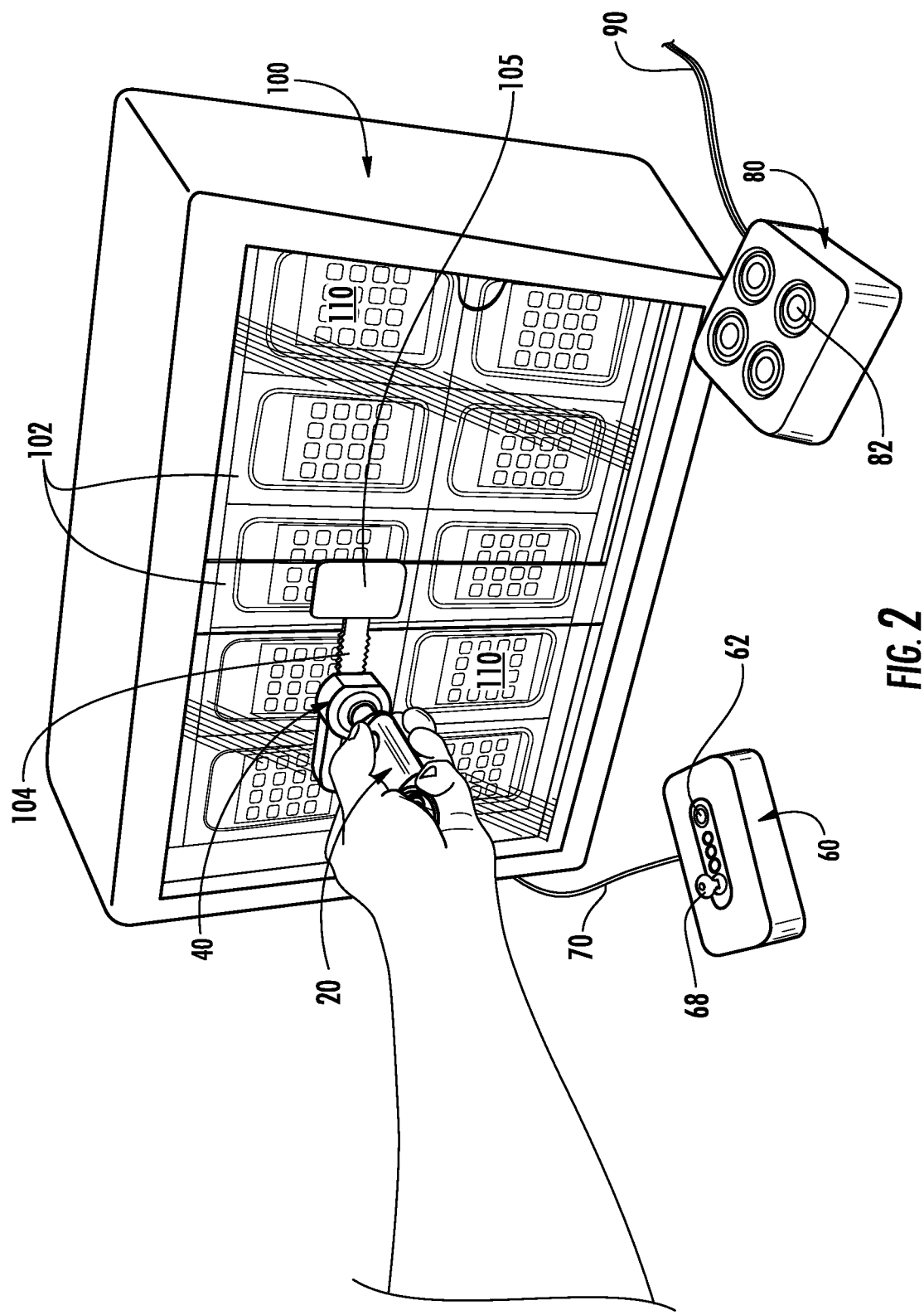
FIG. 2 further shows the system and method of FIG. 1A with the programmable electronic key positioned to operate the security device.

As illustrated in FIG. 2, the security key 20 programmed with the SDC is then positioned to operatively engage the security device 40. In the embodiments shown and described herein, the security device is a conventional cabinet lock that has been modified to be unlocked by the programmable electronic key 20. Preferably, the security device 40 is a "passive" device. As used herein, the term passive is intended to mean that the security device 40 does not have an internal power source sufficient to lock and/or unlock a mechanical lock mechanism. Significant cost savings are obtained by a retailer when the security device 40 is passive since the expense of an internal power source is confined to the security key 20, and one such key is able to operate multiple security devices. If desired, the security device 40 may also be provided with a temporary power source (e.g., capacitor or limited-life battery) having sufficient power to activate an alarm, for example a piezoelectric audible alarm, that is actuated by a sensor, for example a contact, proximity or limit switch, in response to a security breach. The temporary power source may also be sufficient to communicate data, for example a SDC, from the security device 40 to the security key 20 to authenticate the security device and thereby authorize the key to provide power to the security device. With this embodiment of the present invention, the mechanical lock mechanism is operated by electrical power that is transferred from the key 20 to the security device 40 via electrical contacts, as will be described.

The security device 40 further comprises a logic control circuit, similar to the logic control circuit disposed within the key 20, adapted to perform a handshake communication protocol with the logic control circuit of the key in essentially the same manner as that between the programming station 60 and the key. In essence, the logic control circuit of the key 20 and the logic control circuit of the security device 40 communicate with each other to determine whether the security device is an authorized device that does not have a security code, or is a device having a proper (e.g., matching) SDC. The key 20 may be configured to initially transfer power to the security device 40 in the event the security device is a passive device to allow the security device to communicate with the key. In the event the handshake communication protocol fails (e.g., the device is not authorized or the device has a non-matching SDC), the key 20 will not program the device 40 with the SDC, and consequently, the security device will not operate. If the security device 40 was previously programmed with a different SDC, the device will no longer communicate with the security key 20. In the event the handshake communication protocol is successful, the security key 20 permits the SDC stored in the key to be transmitted by the optical transceiver disposed within the key to a cooperating optical transceiver disposed within the security device 40 to program the device with the SDC. As will be readily apparent to those skilled in the art, the SDC may be transmitted from the security key 20 to the security device 40 alternatively by any other suitable means, including without limitation, via one or more electrical contacts, or via electromechanical, electromagnetic or magnetic conductors, as desired. Furthermore, the SDC may be transmitted by inductive transfer of data from the programmable electronic key 20 to the programmable security device 40.

On the other hand, when the handshake communication protocol is successful and the security device 40 is an authorized device having the same (e.g., matching) SDC, the mechanical lock mechanism of the security device 40 may operate using power from the key 20, either power that had been previously transferred by the key and stored by the security device and/or by power transmitted by the key to the security device. In the embodiment of FIGS. 1A-9B, electrical contacts disposed on the security key 20 electrically couple with cooperating electrical contacts on the security device 40 to transfer power from the internal battery of the key to the security device. Power may be transferred directly to the mechanical lock mechanism, or alternatively, may be transferred to a power circuit disposed within the security device 40 that operates the mechanical lock mechanism of the security device and may be configured to store the power for subsequent operation of the lock mechanism. In the embodiment of FIGS. 1A-9B, the cabinet lock 40 is affixed to one of the pair of adjacent and overlapping sliding doors 102 of a conventional cabinet 100. The cabinet 100 typically contains various types of equipment 110. The doors 102 overlap medially between the ends of the cabinet 100 and the cabinet lock 40 is secured on an elongate locking arm 104 of a lock bracket 105 affixed to the inner door. In the illustrated example, the key 20 transfers power to an electric motor, such as a DC stepper motor, solenoid, or the like, that unlocks the lock mechanism of the cabinet lock 40 so that the cabinet lock can be removed from the arm 104 of the bracket 105 and the doors moved (e.g., slid) relative to one another to access the equipment 110 stored within the cabinet 100. As shown, the arm 104 of the bracket 105 is provided with one-way ratchet teeth 106 and the cabinet lock 40 is provided with a complimentary ratchet pawls (not shown) in a conventional manner so that the key 20 is not required to lock the cabinet lock 40 onto the inner door 102 of the cabinet 100. If desired, however, the cabinet lock 40 can be configured to require use of the key 20 to both unlock and lock the cabinet lock.

It will be readily apparent to those skilled in the art that the cabinet lock illustrated herein is but one of numerous types of passive security devices 40 that can be configured to be operated by a programmable electronic key 20 according to the present invention. In any of the aforementioned embodiments, the security device 40 may further comprise an electronic lock mechanism, such as a conventional proximity, limit or contact switch, including an associated monitoring circuit that activates an alarm in response to the switch being actuated or the integrity of a sense loop monitored by the monitoring circuit being compromised. In such embodiments the security device 40 comprises a logic control circuit, or the equivalent, including a memory for storing a SDC, and a communication system for initially receiving the SDC from the security key 20 and subsequently communicating with the key to authenticate the SDC of the key.

Figure 3A:
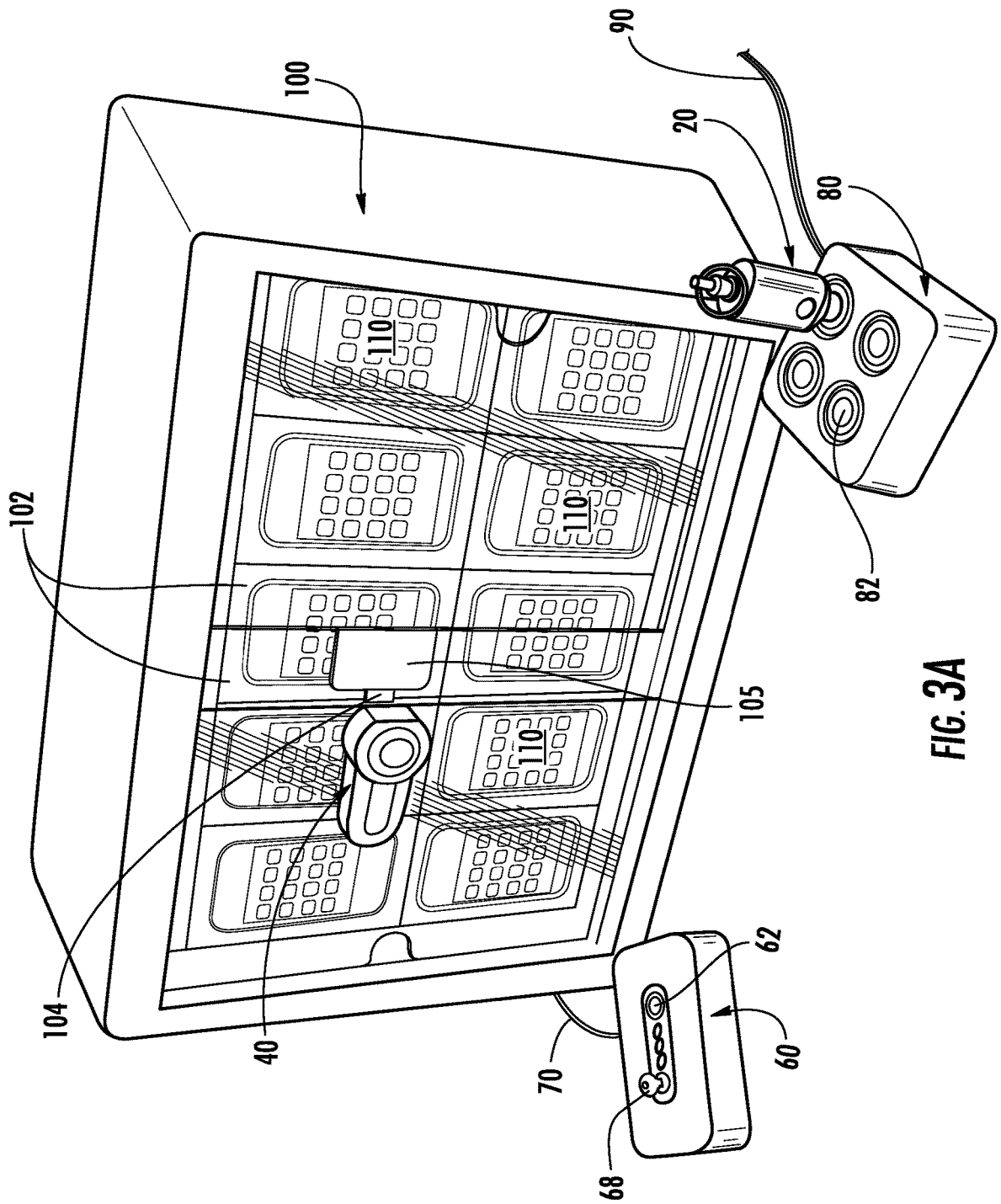
FIG. 3A further shows the system and method of FIG. 1A with the programmable electronic key disposed on the charging station.
Figure 3B:
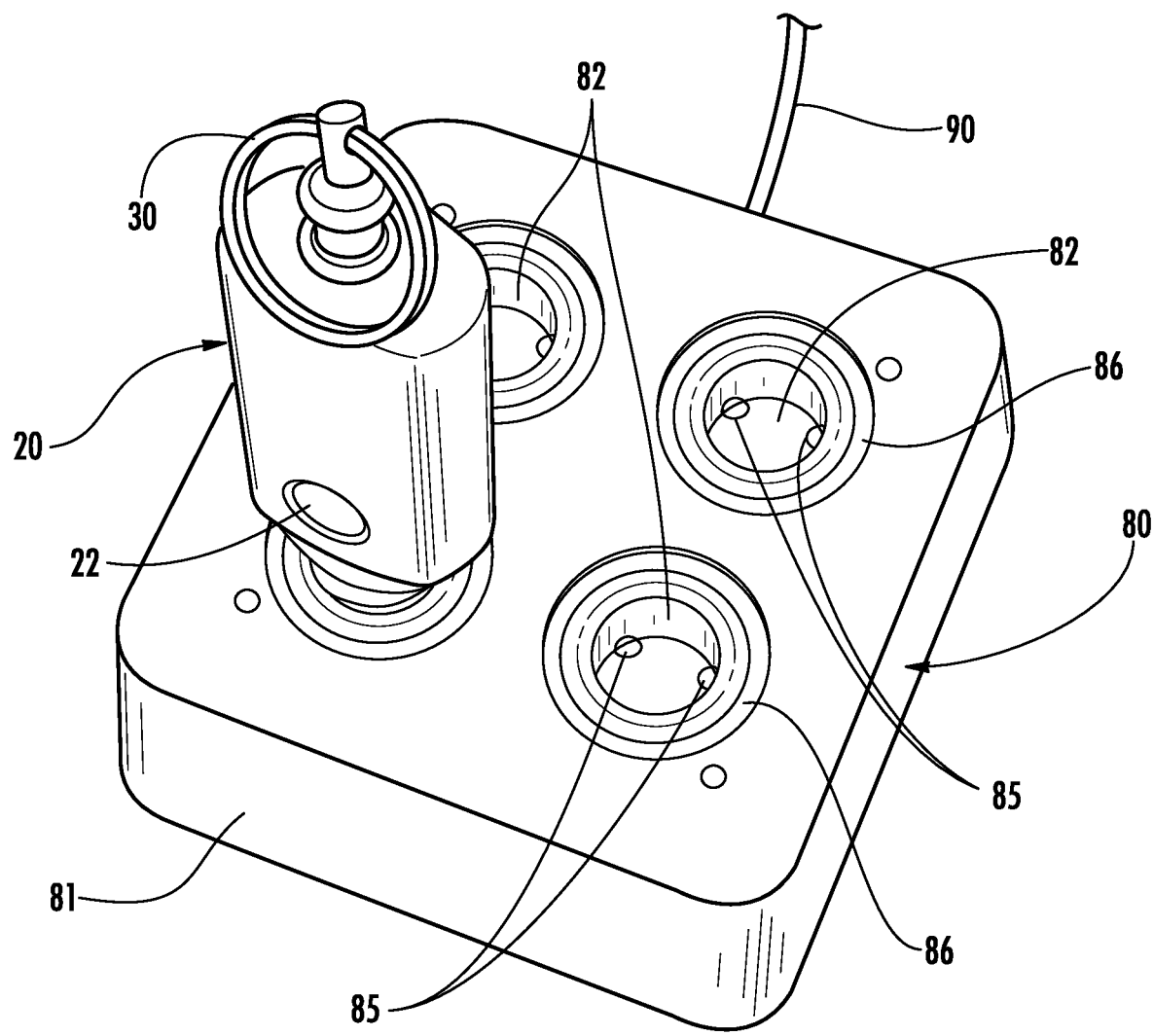
FIG. 3B is an enlarged view showing the programmable electronic key of FIG. 1A positioned on the charging station of FIG. 1A to recharge a power source disposed within the key.

As illustrated in FIG. 3A and shown enlarged in FIG. 3B, the security system and method further comprises charging station 80 for initially charging and subsequently recharging a rechargeable battery disposed within the security key 20. The charging station 80 comprises at least one charging port 82 sized and shaped to receive a key 20 to be charged or recharged. As will be described in greater detail with reference to FIGS. 9A and 9B, each charging port 82 comprises at least one magnet 85 for securely positioning and retaining the key 20 within the charging port 82 in electrical contact with the charging station 80. If desired, the charging station 80 may comprise an internal power source, for example, an extended-life replaceable battery or a rechargeable battery, for providing power to up to four keys 20 positioned within respective charging ports 82. Alternatively, and as shown herein, charging station 80 may be operatively connected to an external power source by a power cord 90 having at least one conductor.

An available feature of a security system and method according to the invention is that the logic control circuit of the programmable electronic key 20 may include a time-out function. More particularly, the ability of the key 20 to transfer data and power to the security device 40 is deactivated after a predetermined time period. By way of example, the logic control circuit may be deactivated after about eight hours from the time the key was programmed or last refreshed by the programming station 60. Thus, an authorized sales associate typically must program or refresh the key 20 assigned to him at the beginning of each work shift. Furthermore, the charging station 80 may be configured to deactivate the logic control circuit of the key 20 (and thereby prevent use of the SDC) when the key is positioned within a charging port 82. In this manner, the charging station 80 can be made available to an authorized sales associate in an unsecured location without risk that a charged key 20 could be removed from the charging station and used to maliciously disarm and/or unlock a security device 40. The security key 20 would then have to be programmed or refreshed with the SDC by the programming station 60, which is typically monitored or maintained at a secure location, in order to reactivate the logic control circuit of the key. If desired, the charging station 80 may alternatively require a matching handshake communication protocol with the programmable electronic key 20 in the same manner as the security device 40 and the key.

Figure 4:
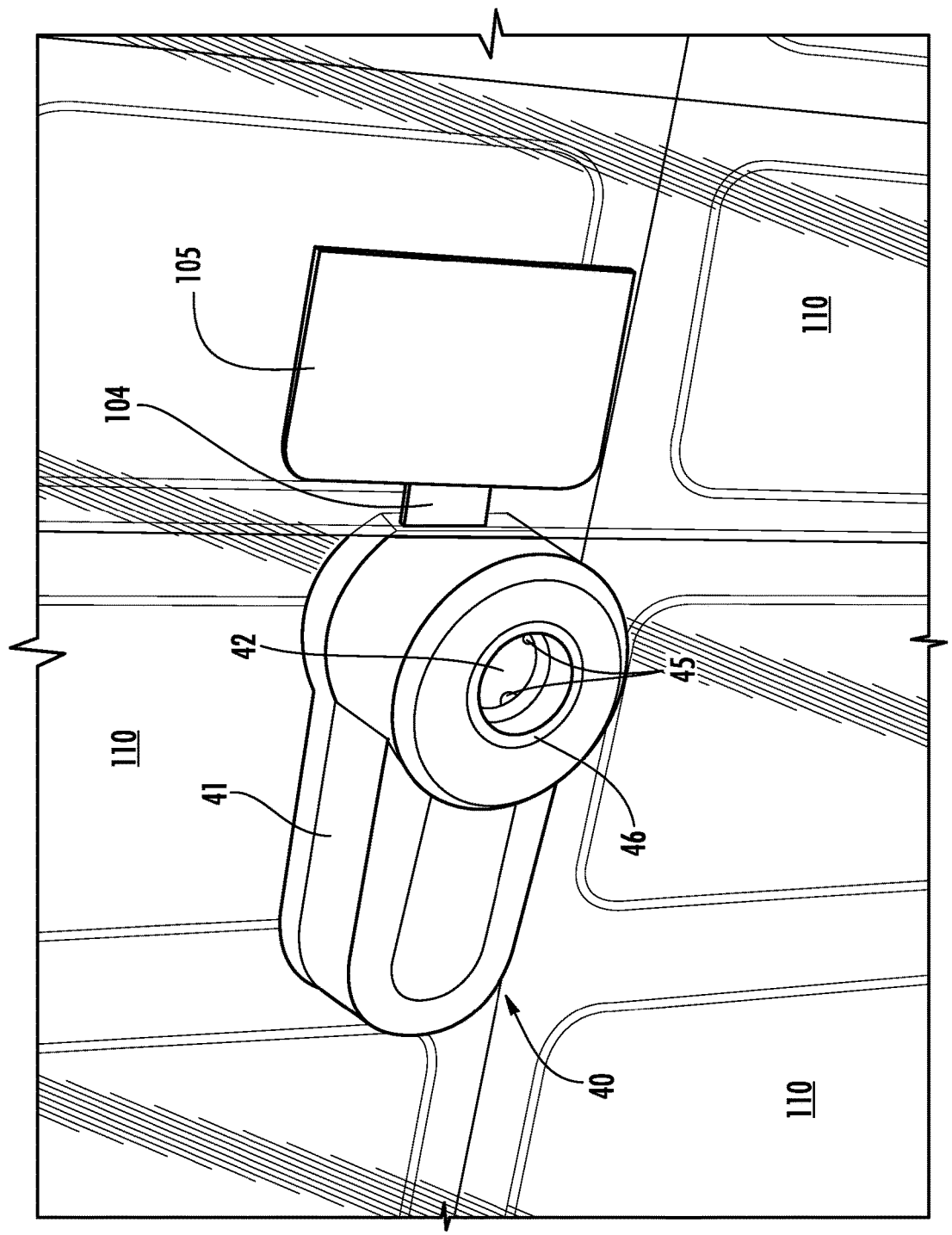
FIG. 4 is an enlarged view showing the security device of the system and method of FIG. 1A.
Figure 5:
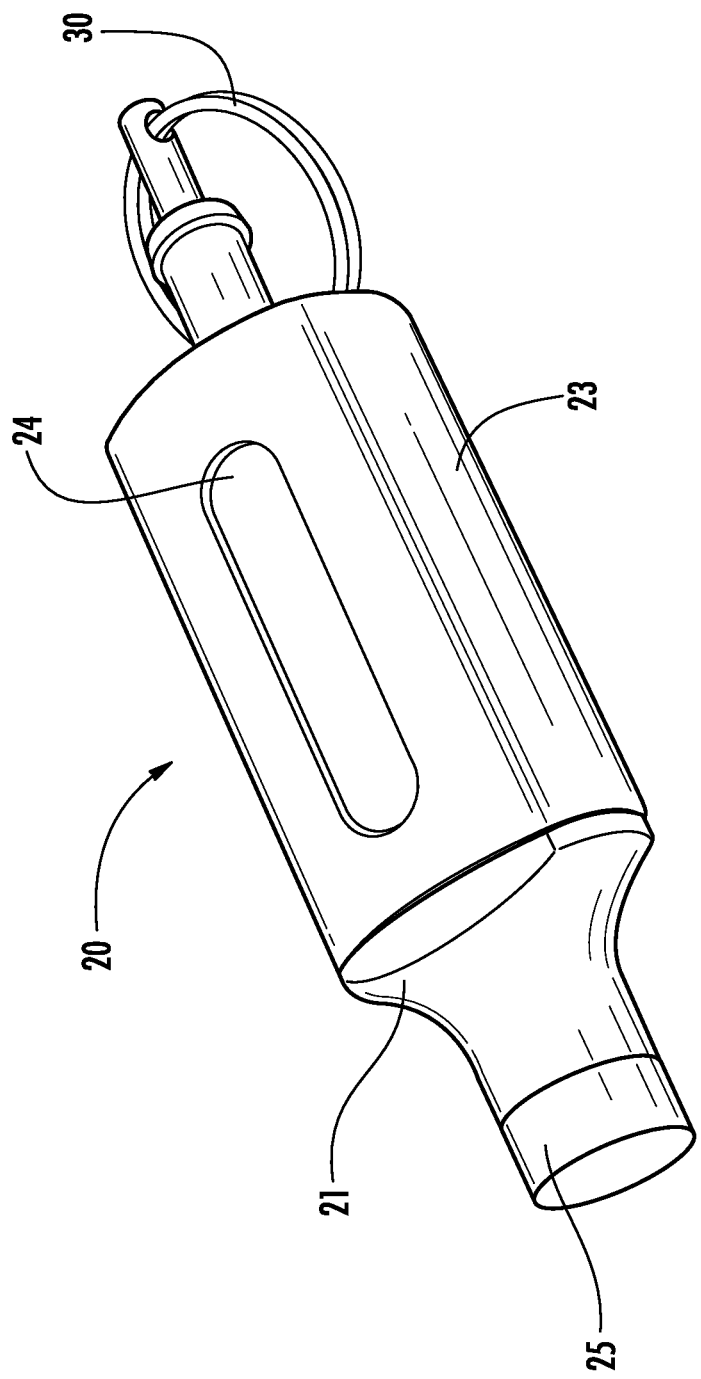
FIG. 5 is an enlarged view showing the programmable electronic key of the system and method of FIG. 1A in greater detail.

FIG. 4 is an enlarged view showing the embodiment of the security device 40 in greater detail. As previously mentioned, a security device 40 according to the present invention may utilize electrical power to lock and/or unlock a mechanical lock mechanism, and optionally, further includes an electronic lock mechanism, such as an alarm or a security "handshake." At the same time, the security device 40 must be a passive device in the sense that it does not have an internal power source sufficient to operate the mechanical lock mechanism. As a result, the security device 40 must be configured to receive at least power, and preferably, both power and data from an external source, such as the security key 20 shown and described herein. The embodiment of the security device depicted in FIG. 4 is a cabinet lock 40 configured to be securely affixed to the locking arm 104 of a conventional cabinet lock bracket 105, as previously described. The cabinet lock 40 comprises a logic control circuit for performing a security handshake communication protocol with the logic control circuit of the security key 20 and for being programmed with the SDC by the key. In other embodiments, the cabinet lock 40 may be configured to transmit the SDC to the security key 20 to authenticate the security device and thereby authorize the key to transfer power to the cabinet lock. As previously mentioned, the data (e.g., handshake communication protocol and SDC) may be transferred (e.g., transmitted and received) by electrical contacts, optical transmission, acoustic transmission or magnetic induction, for example.

The cabinet lock 40 comprises a housing 41 sized and shaped to contain a logic control circuit (not shown) and an internal mechanical lock mechanism (not shown). A transfer port 42 formed in the housing 41 is sized and shaped to receive a transfer probe of the security key 20, as will be described. At least one magnet 45 is disposed within the transfer port 42 for securely positioning and retaining the transfer probe of the key 20 in electrical contact with electrical contacts of the mechanical lock mechanism, and if desired, in electrical contact with the logic control circuit of the cabinet lock 40. In the embodiment shown and described in FIGS. 1A-9B, data is transferred from the security key 20 to the cabinet lock 40 by wireless communication, such as by infrared (IR) optical transmission, as shown and described in the commonly owned U.S. Pat. No. 7,737,843 entitled PROGRAMMABLE ALARM MODULE AND SYSTEM FOR PROTECTING MERCHANDISE, the disclosure of which is incorporated herein by reference in its entirety. Power is transferred from the security key 20 to the cabinet lock 40 through electrical contacts disposed on the transfer probe of the key and corresponding electrical contacts disposed within the transfer port 42 of the cabinet lock. For example, the transfer port 42 may comprise a metallic outer ring 46 that forms one electrical contact, while at least one of the magnets 45 form another electrical contact to complete an electrical circuit with the electrical contacts disposed on the transfer probe of the key 20. Regardless, electrical contacts transfer power from the key 20 to the mechanical lock mechanism disposed within the housing 41. As previously mentioned, the power transferred from the key 20 is used to operate the mechanical lock mechanism, for example utilizing an electric motor, DC stepper motor, solenoid, or the like, to unlock the mechanism so that the cabinet lock 40 can be removed from the locking arm 104 of the lock bracket 105.

FIGS. 5-8 show an embodiment of a security key, also referred to herein as a programmable electronic key, 20 according to the present invention. As previously mentioned, the security key 20 is configured to transfer both data and power to a security device 40 that comprises an electronic lock mechanism and a mechanical lock mechanism, as previously described. Accordingly, the programmable electronic key 20 must be an "active" device in the sense that it has an internal power source sufficient to operate the mechanical lock mechanism of the security device 40. As a result, the programmable electronic key 20 may be configured to transfer both data and power from an internal source disposed within the key, for example a logic control circuit and a battery. The embodiment of the programmable electronic key 20 depicted in FIGS. 5-8 is a security key configured to be received within the transfer port 42 of the cabinet lock 40 shown in FIG. 4, as well as within the programming port 62 of the programming station 60 (FIG. 2; FIG. 3A) and the charging port 82 of the charging station 80 (FIG. 3B; FIG. 9A; FIG. 9B). The programmable electronic key 20 comprises a logic control circuit for performing a handshake communication protocol with the logic control circuit of the programming station 60 and for receiving the SDC from the programming station, as previously described. The logic control circuit of the programmable electronic key 20 further performs a handshake communication protocol with the logic control circuit of the security device 40 and transfers the SDC to the device or permits operation of the device, as previously described. As previously mentioned, the data (e.g., handshake communication protocol and SDC) may be transferred by direct electrical contacts, optical transmission, acoustic transmission or magnetic induction.

Figure 6:
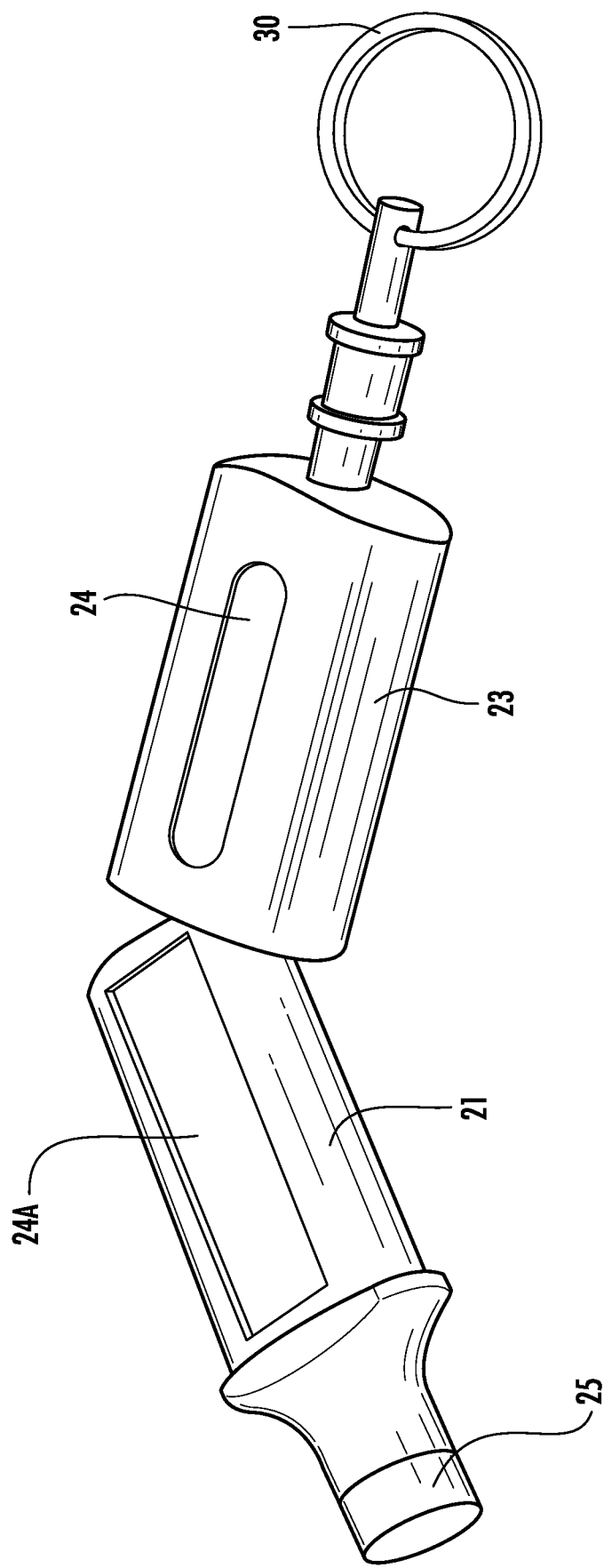
FIG. 6 is an exploded view of the programmable electronic key of FIG. 5.
Figures 7A, 7B:
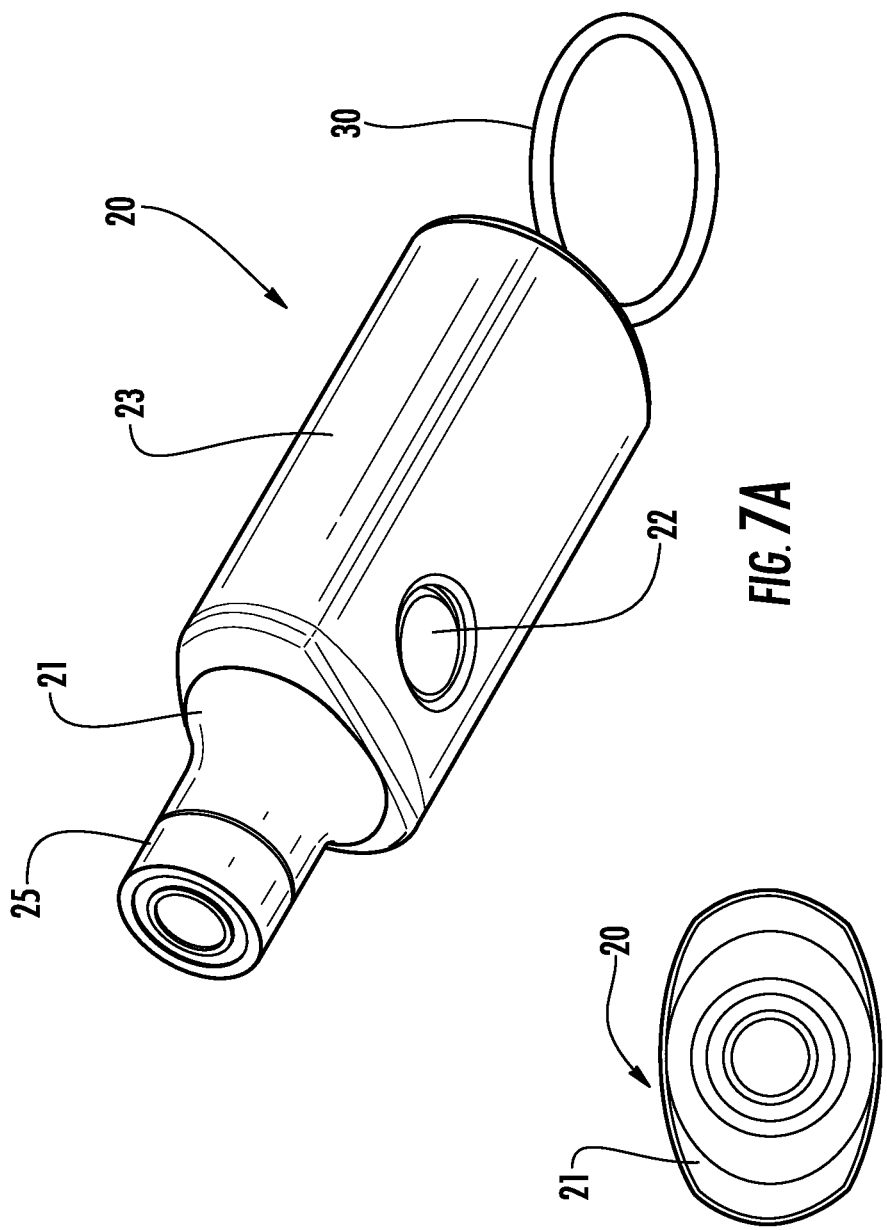
FIG. 7A is a perspective view of the programmable electronic key of FIG. 5.
FIG. 7B is an end view of the programmable electronic key of FIG. 5.

As illustrated in FIG. 6, the programmable electronic key 20 comprises a housing 21 and an outer sleeve 23 that is removably disposed on the housing. The housing 21 contains the internal components of the key 20, including without limitation the logic control circuit, memory, communication system and battery, as will be described. A window 24 may be formed through the outer sleeve 23 for viewing indicia 24A that uniquely identifies the key 20, or alternatively, indicates a particular server rack for use with the key. The outer sleeve 23 is removably disposed on the housing 21 so that the indicia 24A may be altered or removed and replaced with different indicia. The programmable electronic key 20 may further comprise a detachable "quick-release" type key chain ring 30. An opening 26 (FIG. 8) is formed through the outer sleeve 23 and a key chain ring port 28 is formed in the housing 21 for receiving the key chain ring 30. The programmable electronic key 20 further comprises a transfer probe 25 located at an end of the housing 21 opposite the key chain ring port 28 for transferring data and power to the security device 40, as previously described. The transfer probe 25 also transmits and receives the handshake communication protocol and the SDC from the programming station 60, as previously described, and receives power from the charging station 80, as will be described in greater detail with reference to FIG. 9A and FIG. 9B.

Figure 8:
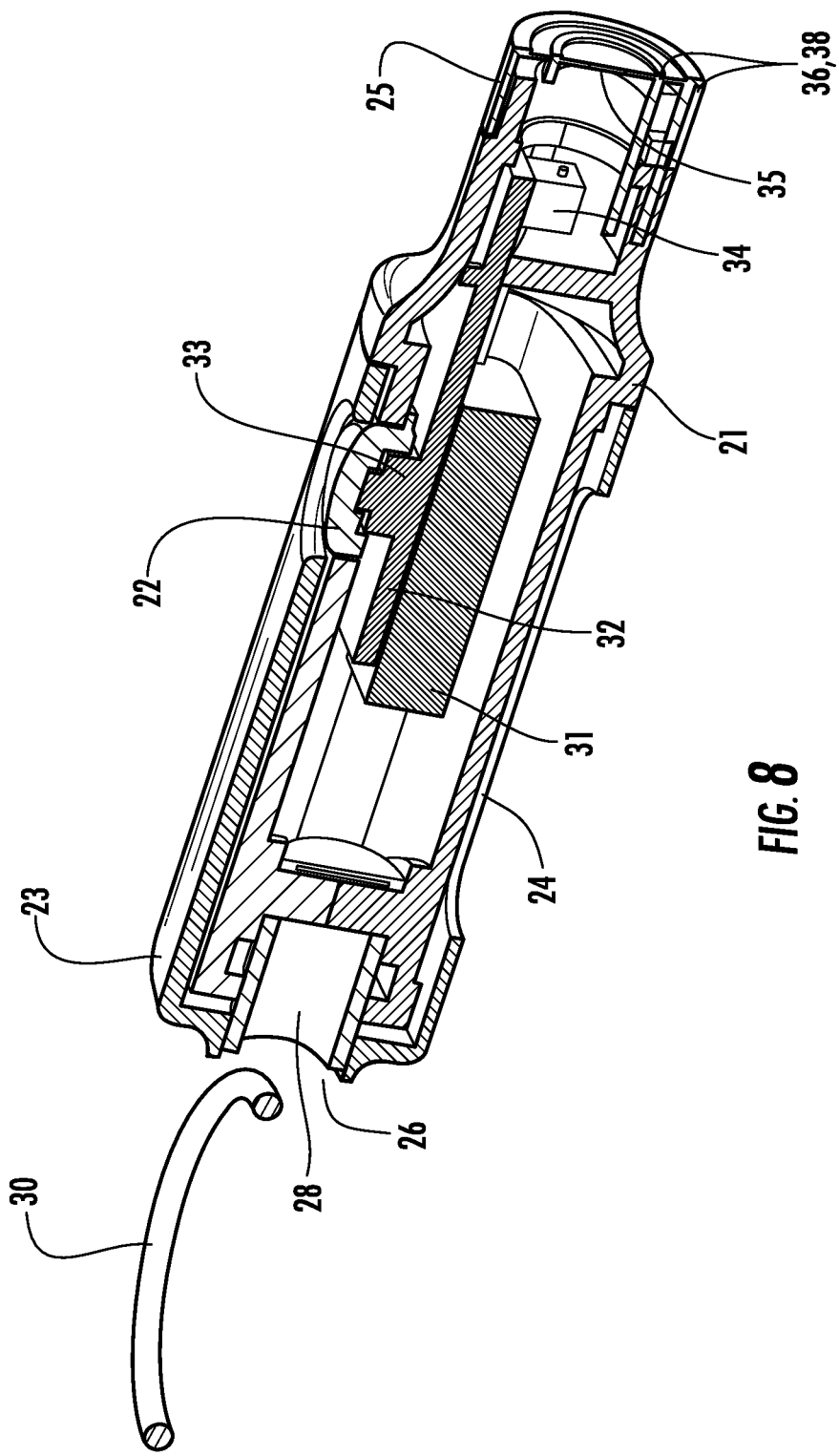
FIG. 8 is a perspective view showing a lengthwise cross-section of the programmable electronic key of FIG. 5.
Figure 9B:
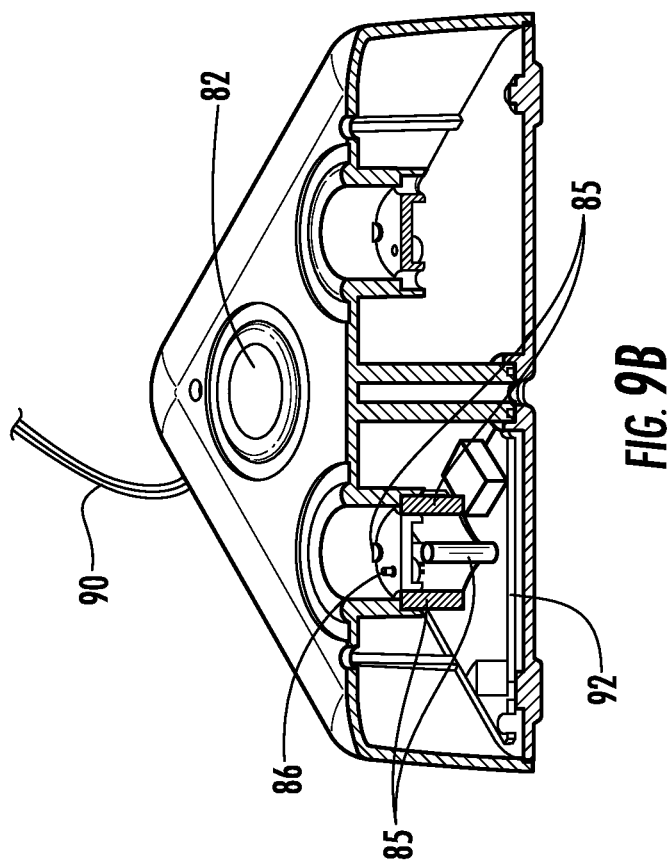
FIG. 9B is a perspective view showing a diagonal cross-section of the charging station of FIG. 9A taken along the line 9B-9B.
Figure 9A:
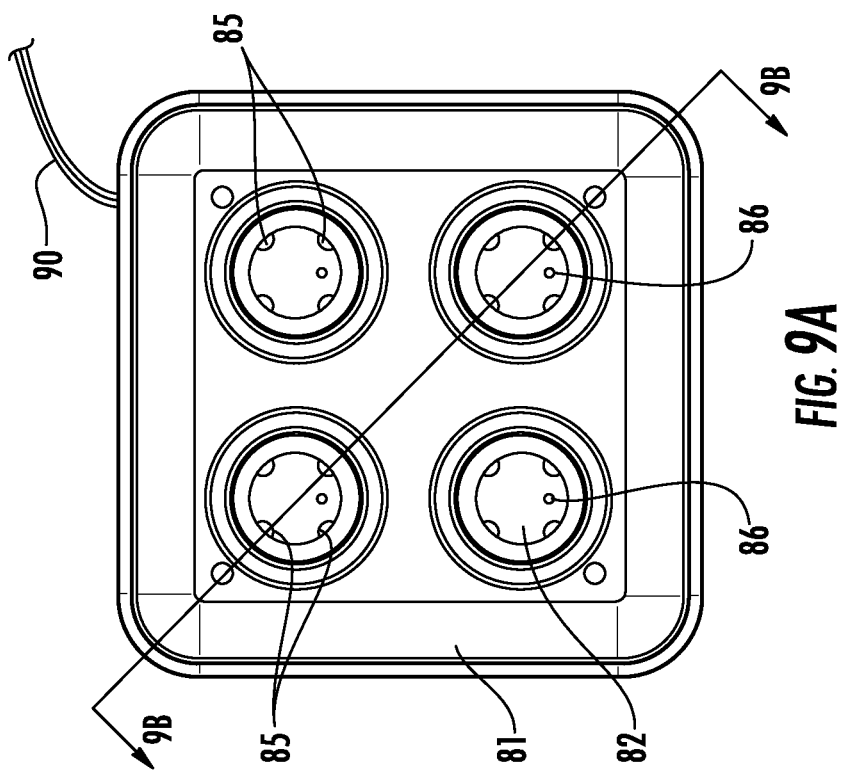
FIG. 9A is a top view showing the charging station of the system and method of FIG. 1A.
Figure 10:
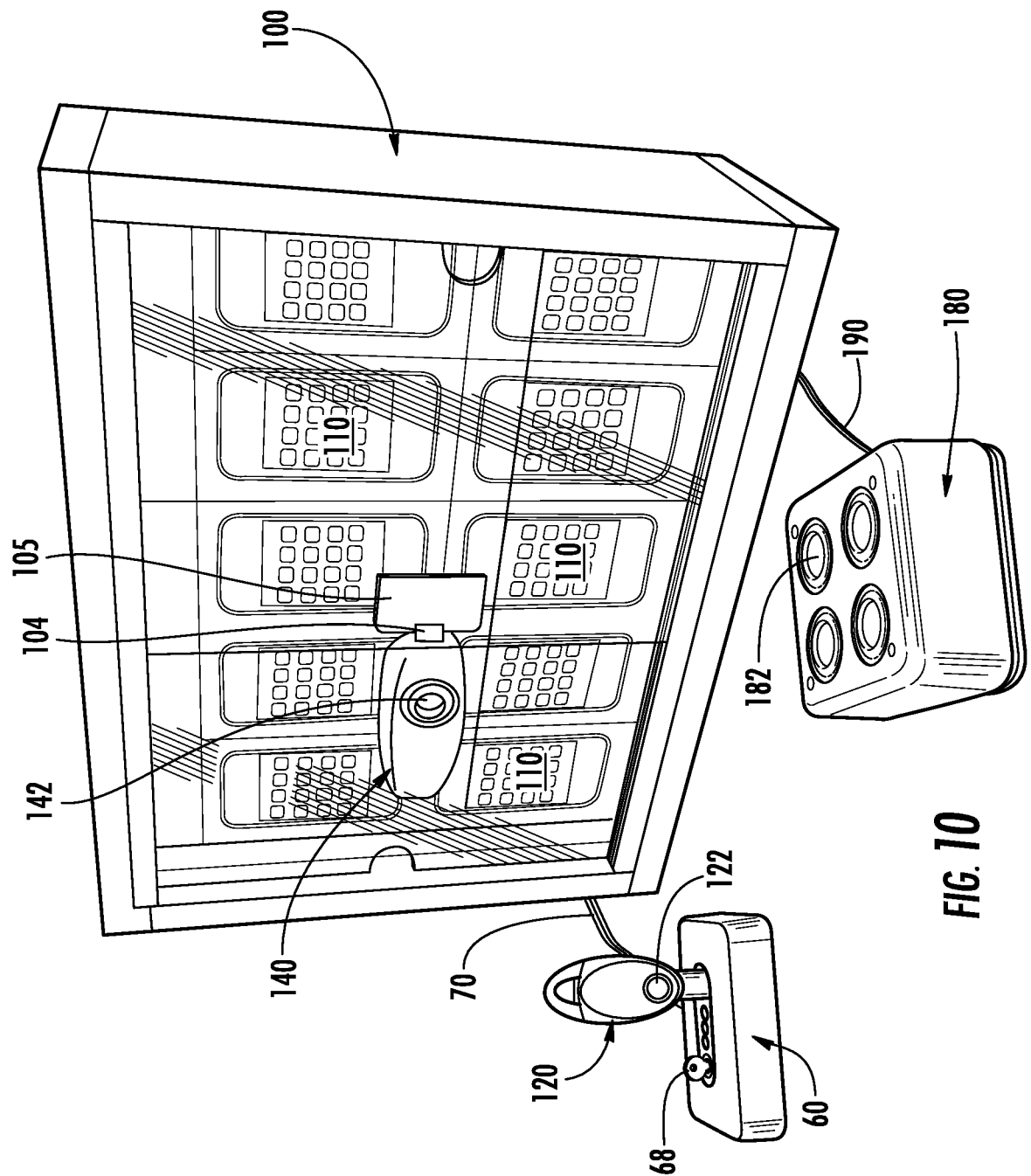
FIG. 10 shows another embodiment of a security system and method including a programmable electronic key, a security device, a programming station and a charging station according to an embodiment of the invention.

As best shown in FIG. 8, an internal battery 31 and a logic control circuit, or printed circuit board (PCB) 32 are disposed within the housing 21 of the programmable electronic key 20. Battery 31 may be a conventional extended-life replaceable battery, but preferably, is a rechargeable battery suitable for use with the charging station 80. The logic control circuit 32 is operatively coupled and electrically connected to a switch 33 that is actuated by the control button 22 provided on the exterior of the key 20 through the outer sleeve 23. Control button 22 in conjunction with switch 33 controls certain operations of the logic control circuit 32, and in particular, transmission of the data to the security device 40. In that regard, the logic control circuit 32 is further operatively coupled and electrically connected to a communication system 34 for transmitting and receiving the handshake communication protocol and SDC data. In the embodiment shown and described herein, the communication system 34 is a wireless infrared (IR) transceiver for optical transmission of data between the programmable electronic key 20 and the programming station 60, as well as between the key 20 and the security device 40. As a result, the transfer probe 25 of the key 20 is provided with an optically transparent or translucent filter window 35 for emitting and collecting optical transmissions between the key 20 and the programming station 60, or alternatively, between the key 20 and the security device 40, as required. Transfer probe 25 further comprises a pair of bi-directional power transfer electrical contacts 36, 38 made of an electrically conductive material for transferring power to the security device 40 and for receiving power from the charging station 80, as required. Accordingly, electrical contacts 36, 38 are electrically connected to battery 31, and are operatively coupled and electrically connected to logic control circuit 32 in any suitable manner, for example by conductive insulated wires or plated conductors.

An important aspect of a programmable electronic key 20 according to the present invention, especially when used for use in conjunction with a security device 40 as described herein, is that the key does not require a physical force to be exerted by a user on the key to operate the mechanical lock mechanism of the security device. By extension, no physical force is exerted by the key on the mechanical lock mechanism. As a result, the key cannot be unintentionally broken off in the lock, as often occurs with conventional mechanical key and lock mechanisms. Furthermore, neither the key nor and the mechanical lock mechanism suffer from excessive wear as likewise often occurs with conventional mechanical key and lock mechanisms. In addition, there is no required orientation of the transfer probe 25 of the programmable electronic key 20 relative to the charging port 82 of the charging station 80 or the transfer port 42 of the security device 40. Accordingly, any wear of the electrical contacts on the transfer probe 25, the charging port 82 or the transfer port 42 is minimized. As a further advantage, an authorized person is not required to position the transfer probe 25 of the programmable electronic key 20 in a particular orientation relative to the transfer port 42 of the security device 40 and thereafter exert a compressive and/or torsional force on the key to operate the mechanical lock mechanism of the device.

FIG. 9A and FIG. 9B show charging station 80 in greater detail. As previously mentioned, the charging station 80 recharges the internal battery 31 of the programmable electronic key 20, and if desired, deactivates the data transfer and/or power transfer capability of the key until the key is reprogrammed with the SDC by the programming station 60. Regardless, the charging station 80 comprises a housing 81 for containing the internal components of the charging station. The exterior of the housing 81 has at least one, and preferably, a plurality of charging ports 82 formed therein that are sized and shaped to receive the transfer probe 25 of the security key 20, as previously described. At least one magnet 85 is disposed within each charging port 82 for securely positioning and retaining the transfer probe 25 in electrical contact with the charging station 80. More particularly, the electrical contacts 36, 38 of the key 20 are retained within the charging port 82 in electrical contact with the magnets 85 and a resilient "pogo" pin 86 made of a conductive material to complete an electrical circuit between the charging station 80 and the battery 31 of the key.

As best shown in FIG. 9B, housing 81 is sized and shaped to contain a logic control circuit, or printed circuit board (PCB) 92 that is operatively coupled and electrically connected to the magnets 85 and the pogo pin 86 of each charging port 82. The pogo pin 86 is depressible to complete an electrical circuit as the magnets 85 position and retain the electrical contacts 36, 38 within the charging port 82. In particular, magnets 85 make electrical contact with the outer ring electrical contact 36 of the transfer probe 25 of key 20, while pogo pin 86 makes electrical contact with inner ring electrical contact 38 of the transfer probe. When the pogo pin 86 is depressed and the electrical circuit between the charging station 80 and the key 20 is completed, the charging station recharges the internal battery 31 of the key. As previously mentioned, charging station 80 may comprise an internal power source, for example, an extended-life replaceable battery or a rechargeable battery, for providing power to the key(s) 20 positioned within the charging port(s) 82. Alternatively, and as shown herein, the logic control circuit 92 of the charging station 80 is electrically connected to an external power source by a power cord 90 having at least one conductor. Furthermore, logic control circuit 92 may be operable for deactivating the data transfer and power transfer functions of the programmable electronic key 20, or alternatively, for activating the "time-out" feature of the key until it is reprogrammed or refreshed by the programming station 60.

FIGS. 10-17B show another embodiment of a security system and method including a programmable key, a security device, a programming station, and a charging station according to various embodiments of the present invention. In this embodiment, the system and method comprise at least a programmable electronic key (also referred to herein as a security key) with inductive transfer, indicated generally at 120, and a security device with inductive transfer capability, indicated generally at 140, that is operated by the key 120. The programmable electronic key 120 is useable with any security device or locking device, such as various types of server racks as discussed above, with inductive transfer capability that requires power transferred from the key to the device by induction, or alternatively, requires data transferred between the key and the device and power transferred from the key to the device by induction.

Figure 11:
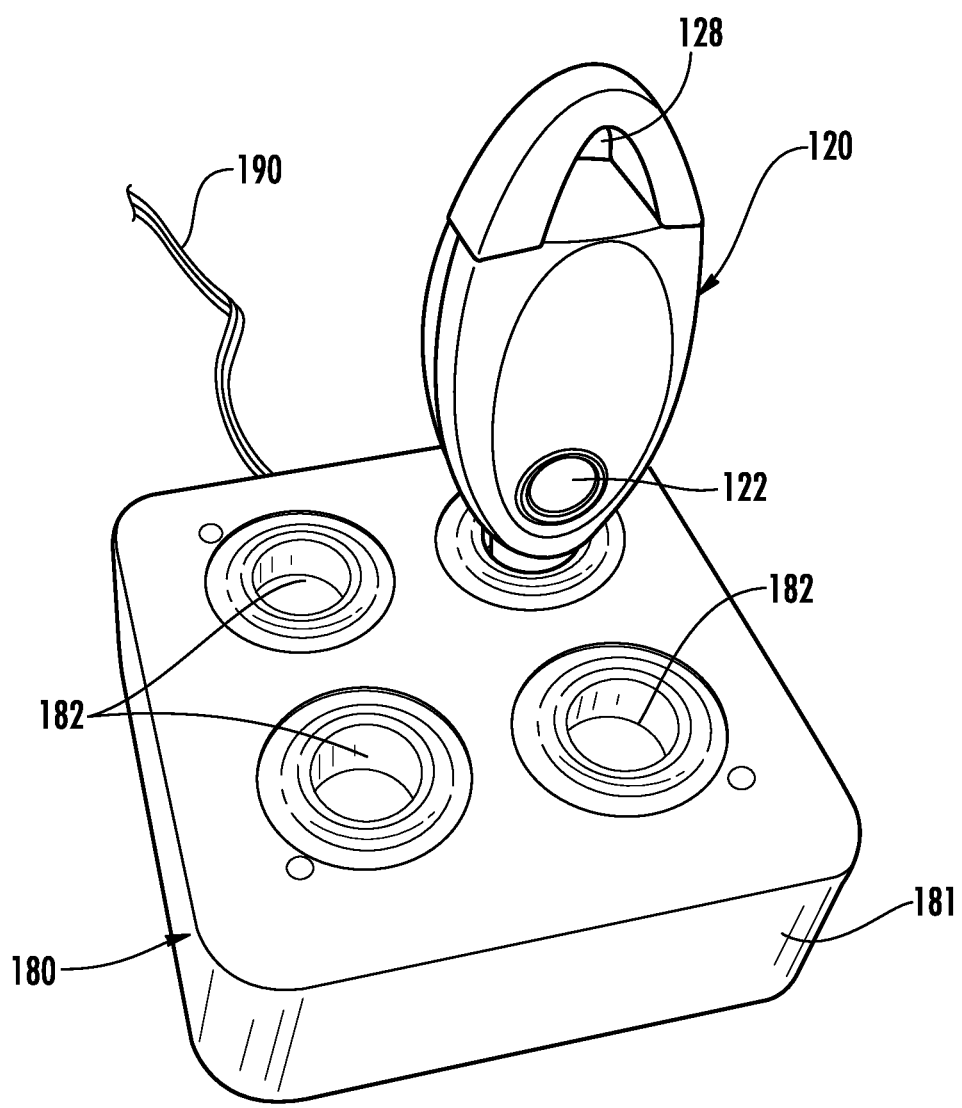
FIG. 11 is an enlarged view showing the programmable electronic key of FIG. 10 positioned on the charging station of FIG. 10 to recharge a power source disposed within the key.

As illustrated in FIG. 11, the security system and method may further comprise a charging station 180 for initially charging and subsequently recharging a rechargeable battery disposed within the security key 120 via inductive transfer. The charging station 180 comprises at least one charging port 182 sized and shaped to receive a security key 120. If desired, each charging port 182 may comprise mechanical or magnetic means for properly positioning and securely retaining the key 120 within the charging port. By way of example and without limitation, at least one, and preferably, a plurality of magnets (not shown) may be provided for positioning and retaining the key 120 within the charging port 182 of the charging station 180. However, as will be described further with reference to FIG. 17B, it is only necessary that the inductive transceiver of the security key 120 is sufficiently aligned with the corresponding inductive transceiver of the charging station 180 over a generally planar surface within the charging port 182. Thus, magnets are not required (as with charging station 80) to position, retain and maintain electrical contacts provided on the security key 120 in electrical contact with corresponding electrical contacts provided on the charging station 180. If desired, the charging station 180 may comprise an internal power source, for example, an extended-life replaceable battery or a rechargeable battery, for providing power to the key(s) 120 positioned within the charging port(s) 182. Alternatively, and as shown herein, charging station 180 may be operatively connected to an external power source by a power cord 190 having at least one conductor in a conventional manner.

Figure 12:
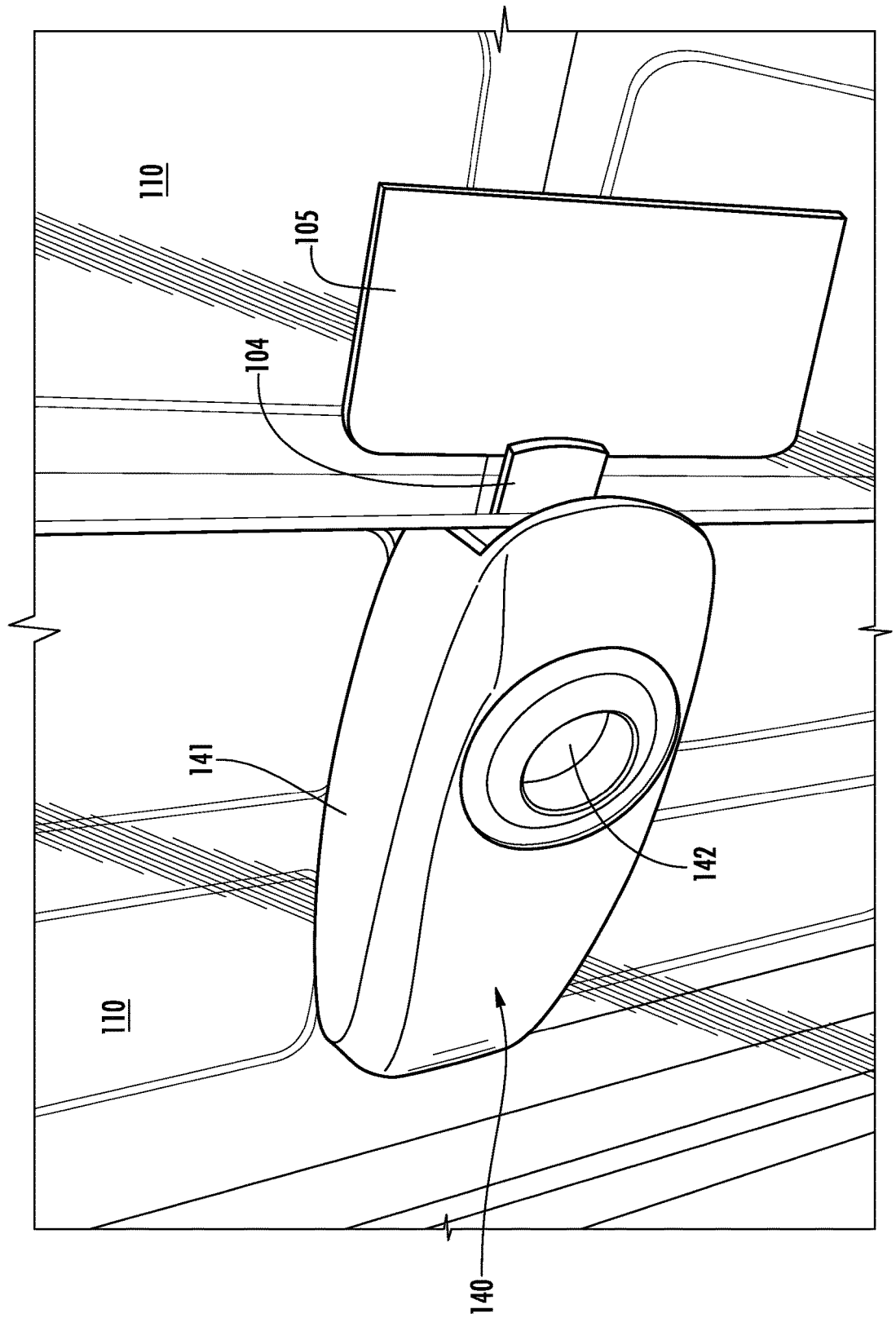
FIG. 12 is an enlarged view showing the security device of the system and method of FIG. 10.
Figure 13:
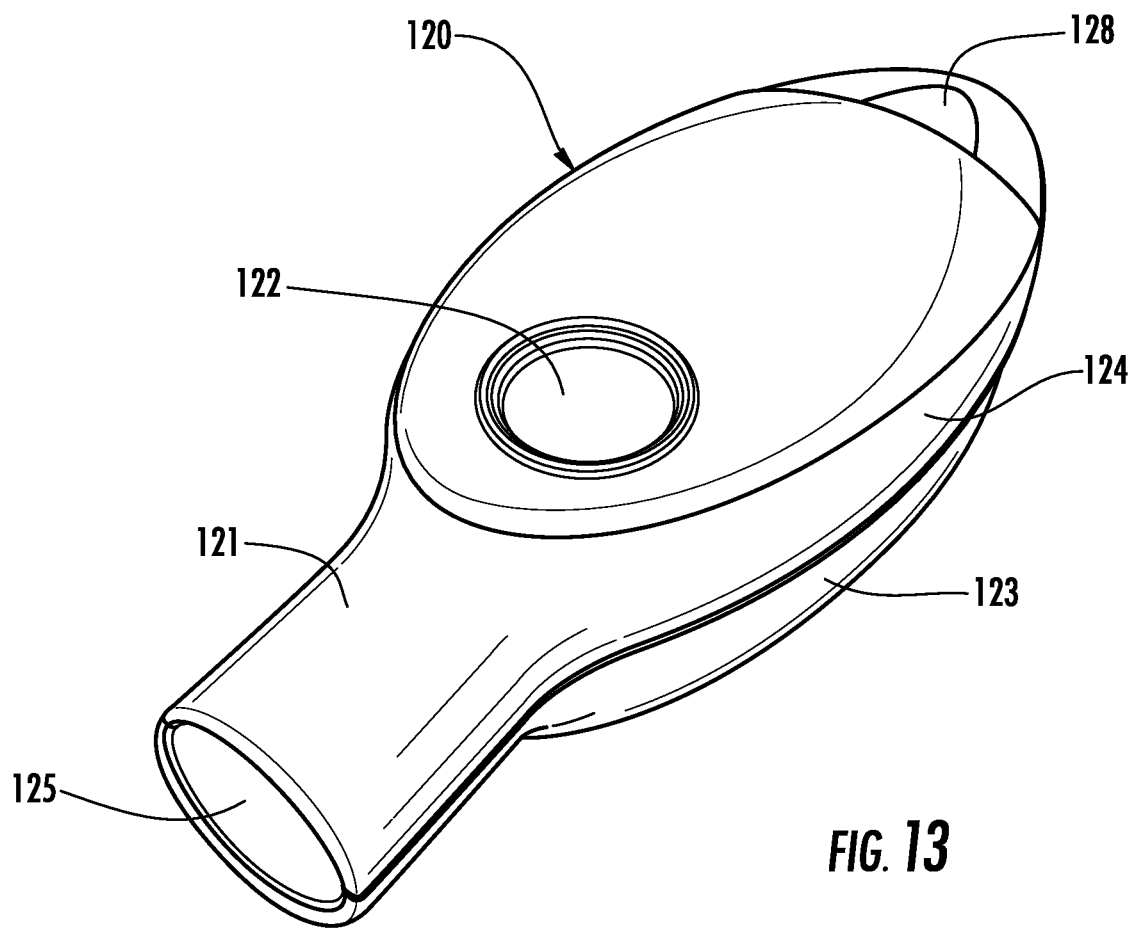
FIG. 13 is an enlarged view showing the programmable electronic key of the system and method of FIG. 10 in greater detail.

FIG. 12 shows the security device 140 with inductive transfer in greater detail. In a particular embodiment, a security device 140 with inductive transfer according to the invention may both receive electrical power from the security key 120 and communicate (e.g., transmit/receive) the SDC with the key by magnetic induction.

The cabinet lock 140 comprises a housing 141 sized and shaped to contain a logic control circuit (not shown) and an internal mechanical lock mechanism (not shown). A transfer port 142 formed in the housing 141 is sized and shaped to receive a transfer probe of the security key 120, as will be described. If desired, the transfer port 142 may comprise mechanical or magnetic means for properly positioning and securely retaining the key 120 within the transfer port. By way of example and without limitation, at least one, and preferably, a plurality of magnets (not shown) may be provided for positioning and retaining the key 120 within the transfer port 142 of the cabinet lock 140. However, as previously described with respect to the security key 120 and the charging port 182 of the charging station 180, it is only necessary that the inductive transceiver of the security key 120 is sufficiently aligned with the corresponding inductive transceiver of the cabinet lock 140 over a generally planar surface within the transfer port 42. Therefore, magnets are not required to position, retain and maintain electrical contacts provided on the security key 120 in electrical contact with corresponding electrical contacts provided on the cabinet lock 140. In the particular embodiment shown and described herein, data is transferred from the security key 120 to the cabinet lock 140 by wireless communication, such as infrared (IR) optical transmission as shown and described in the aforementioned U.S. Pat. No. 7,737,843. Power is transferred from the security key 120 to the cabinet lock 140 by induction across the transfer port 142 of the cabinet lock using an inductive transceiver disposed within a transfer probe of the key that is aligned with a corresponding inductive transceiver disposed within the cabinet lock. For example, the transfer probe of the security key 120 may comprise an inductive transceiver coil that is electrically connected to the logic control circuit of the key to provide electrical power from the internal battery of the key to an inductive transceiver coil disposed within the cabinet lock 140. The inductive transceiver coil of the cabinet lock 140 then transfers the electrical power from the internal battery of the key 120 to the mechanical lock mechanism disposed within the housing 141 of the cabinet lock. As previously mentioned, the power transferred from the key 120 is used to unlock the mechanical lock mechanism, for example utilizing an electric motor, DC stepper motor, solenoid, or the like, so that the cabinet lock 140 can be removed from the arm 104 of the lock bracket 105.

FIGS. 13-16 show the programmable electronic key 120 with inductive transfer in greater detail. As previously mentioned, the key 120 is configured to transfer both data and power to a security device 140 that comprises an electronic lock mechanism and a mechanical lock mechanism. Accordingly, the programmable electronic key 120 must be an active device in the sense that it has an internal power source sufficient to operate the mechanical lock mechanism of the security device 140. As a result, the programmable electronic key 120 may be configured to transfer both data and power from an internal source, such as a logic control circuit and a battery disposed within the key. The embodiment of the programmable electronic key 120 depicted herein is a security key with inductive transfer capability configured to be received within the transfer port 145 of the cabinet lock 140 shown in FIG. 12, as well as the programming port 62 of the programming station 60 (FIG. 2) and the charging port 182 of the charging station 180 (FIG. 11). The programmable electronic key 120 comprises a logic control circuit for performing a handshake communication protocol with the logic control circuit of the programming station 60 and for receiving the SDC from the programming station, as previously described. The logic control circuit of the programmable electronic key 120 further performs a handshake communication protocol with the logic control circuit of the security device 140 and transfers the SDC to the security device, as previously described. In a particular embodiment, a security key 120 with inductive transfer according to the invention may both transfer electrical power to a security device 140 and communicate the SDC with the security device by magnetic induction.

The programmable electronic key 120 comprises a housing 121 having an internal cavity or compartment that contains the internal components of the key, including without limitation the logic control circuit, memory, communication system and battery, as will be described. As shown, the housing 121 is formed by a lower portion 123 and an upper portion 124 that are joined together after assembly, for example by ultrasonic welding. The programmable electronic key 120 further defines an opening 128 at one end for coupling the key to a key chain ring, lanyard or the like. As previously mentioned, the programmable electronic key 120 further comprises a transfer probe 125 located at an end of the housing 121 opposite the opening 128 for transferring data and power to the security device 140. The transfer probe 125 is also operable to transmit and receive the handshake communication protocol and the SDC from the programming station 60, as previously described, and to receive power from the charging station 180, as will be described in greater detail with reference to FIG. 17A and FIG. 17B.

Figure 14:
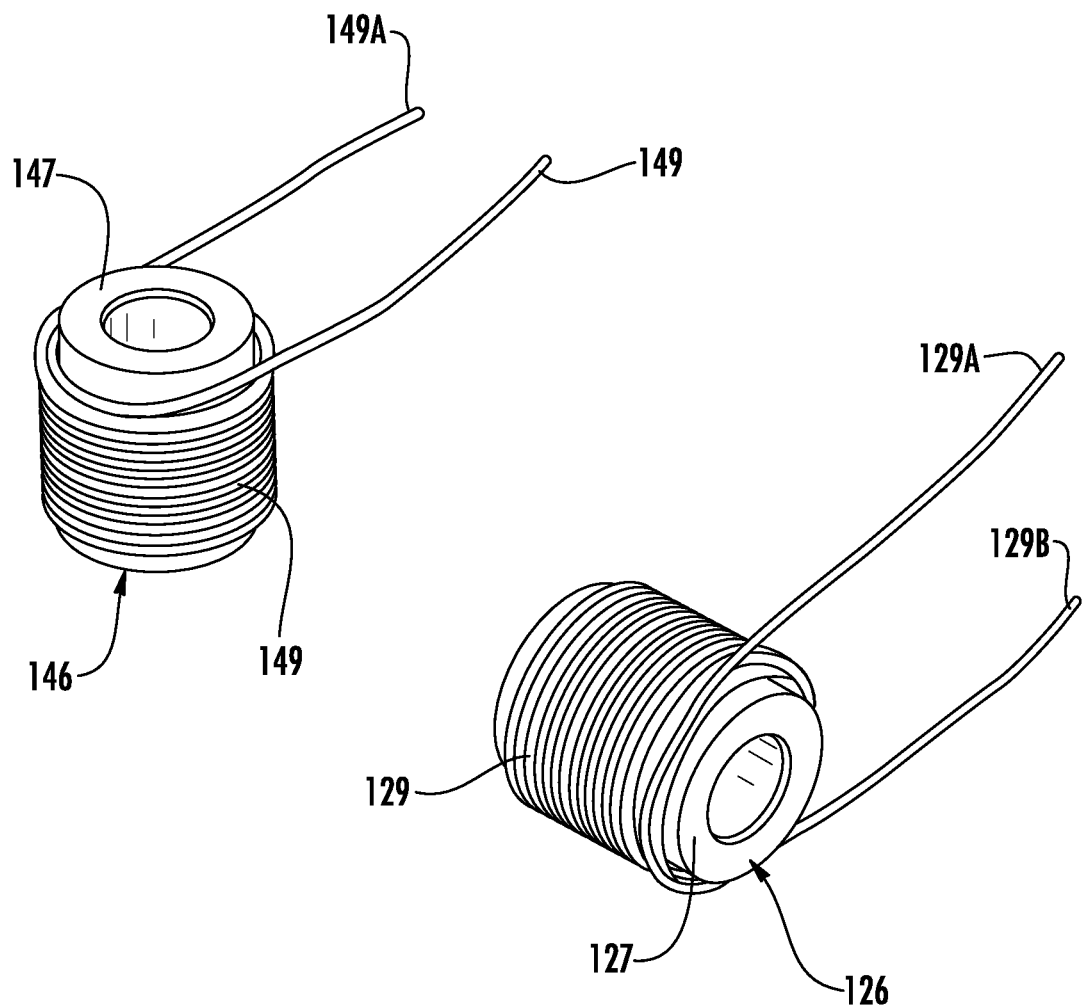
FIG. 14 is a perspective view showing a pair of matched coils for use with the programmable electronic key and the security device of FIG. 10.
Figure 15B:
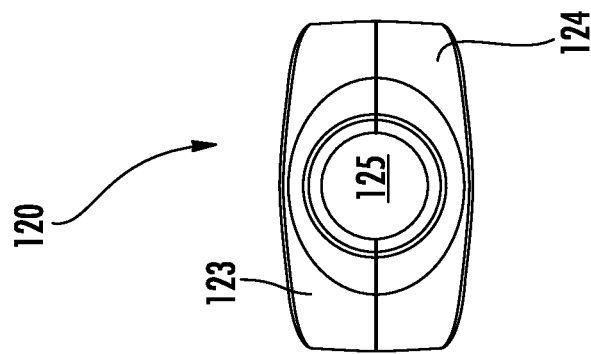
FIG. 15B is an end view of the programmable electronic key of FIG. 13.
Figure 15A:
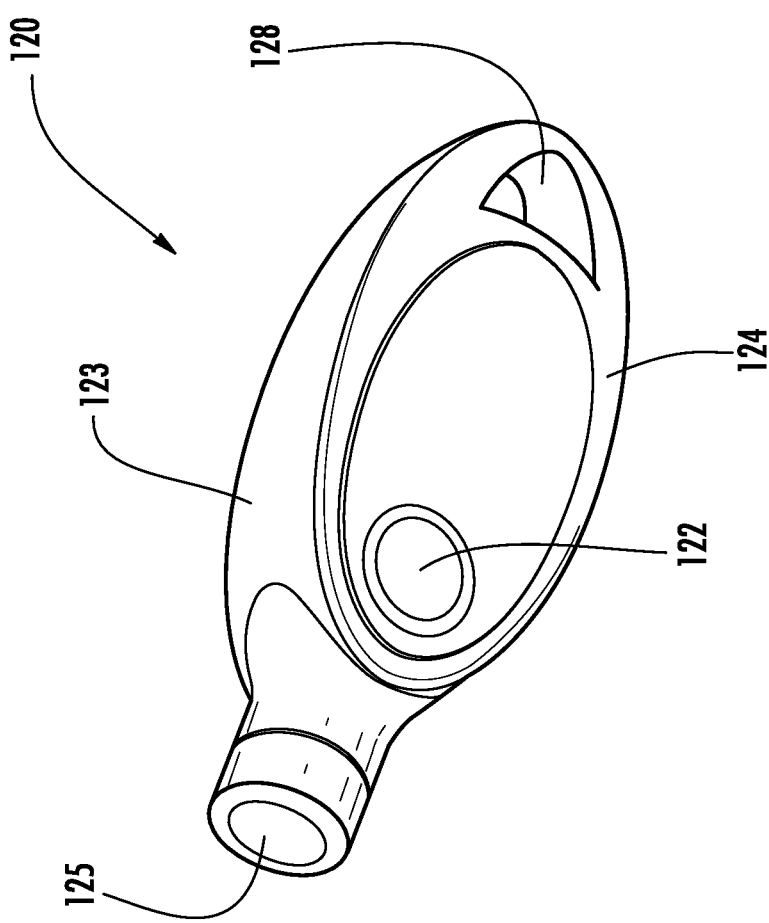
FIG. 15A is a perspective view of the programmable electronic key of FIG. 13.

FIG. 14 shows an embodiment of an inductive coil 126 having high magnetic permeability that is adapted to be disposed within the housing 121 of the electronic key 120 adjacent the transfer probe 125. As shown herein, the inductive coil 126 comprises a highly magnetically permeable ferrite core 127 surrounded by a plurality of inductive core windings 129. The inductive core windings 129 consist of a length of a conductive wire that is wrapped around the ferrite core. As is well known, passing an alternating current through the conductive wire generates, or induces, a magnetic field around the inductive core 127. The alternating current in the inductive core windings 129 may be produced by connecting the leads 129A and 129B of the conductive wire to the internal battery of the electronic key 120 through the logic control circuit. FIG. 14 further shows an inductive coil 146 having high magnetic permeability that is adapted to be disposed within the housing 141 of the security device (e.g., cabinet lock) 140 adjacent the transfer port 142. As shown herein, the inductive coil 146 comprises a highly magnetically permeable ferrite core 147 surrounded by a plurality of inductive core windings 149 consisting of a length of a conductive wire that is wrapped around the ferrite core. Placing the transfer probe 125 of the electronic key 120 into the transfer port 142 of the cabinet lock 140 and passing an alternating current through the inductive core windings 129 of the inductive core 126 generates a magnetic field within the transfer port of the cabinet lock in the vicinity of the inductive coil 146. As a result, an alternating current is generated, or induced, in the conductive wire of the inductive core windings 149 of inductive coil 146 having leads 149A and 149B connected to the logic control circuit of the cabinet lock 140. The alternating current induced in the inductive coil 146 of the cabinet lock 140 is then transformed into a direct current in a known manner, such as via a bridge rectifier on the logic control circuit, to provide direct current (DC) power to the cabinet lock. The DC power generated in the cabinet lock 140 by the inductive coil 126 of the electronic key 120, may be used, for example, to unlock a mechanical lock mechanism disposed within the housing 141 of the cabinet lock.

Figure 16:
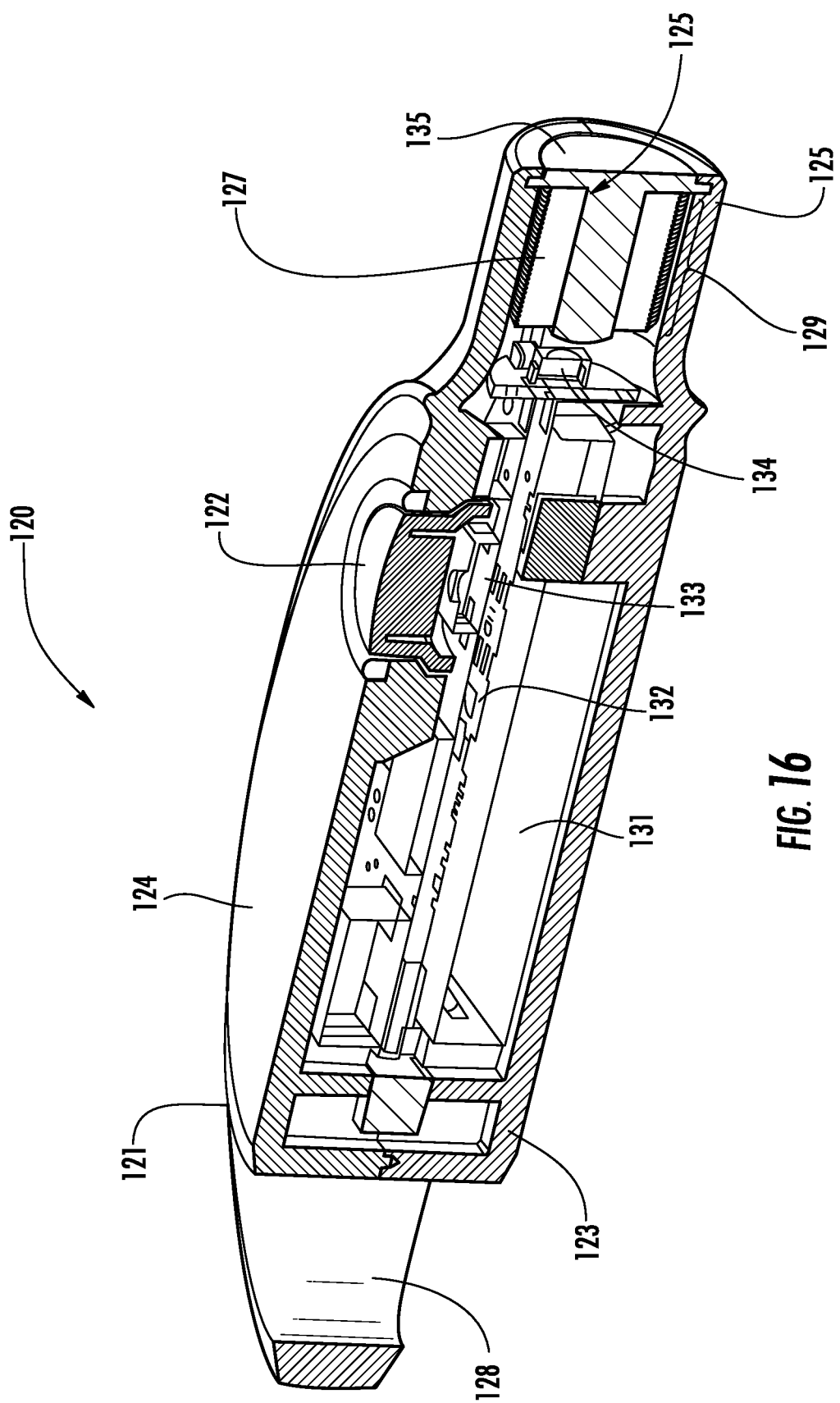
FIG. 16 is a perspective view showing a lengthwise cross-section of the programmable electronic key of FIG. 13.

As best shown in FIG. 16, an internal battery 131 and a logic control circuit, or printed circuit board (PCB) 132 are disposed within the housing 121 of the programmable electronic key 120. Battery 131 may be a conventional extended-life replaceable battery, but preferably, is a rechargeable battery suitable for use with the charging station 180. The logic control circuit 132 is operatively coupled and electrically connected to a switch 133 that is actuated by the control button 122 provided on the exterior of the key 120 through the housing 121. Control button 122 in conjunction with switch 133 controls certain operations of the logic control circuit 132, and in particular, transmission of the data (e.g., handshake communication protocol and SDC) between the key and the programming station 60, as well as between the key and the security device 140. In that regard, the logic control circuit 132 is further operatively coupled and electrically connected to a communication system 134 for transferring the handshake communication protocol and SDC data. As shown and described herein, the communication system 134 is a wireless infrared (IR) transceiver for optical transmission of data between the programmable electronic key 120 and the programming station 60, and between the key and the security device 140. As a result, the transfer probe 125 of the key 120 is provided with an optically transparent or translucent filter window 135 for emitting and collecting optical transmissions between the key 120 and the programming station 60, or between the key and the security device 140, as required. Transfer probe 125 further comprises inductive coil 126 (FIG. 14) comprising inductive core 127 and inductive core windings 129 for transferring electrical power to the security device 140 and/or receiving electrical power from the charging station 180 to charge the internal battery 131, as required. Accordingly, the leads 129A and 129B (FIG. 14) of the inductive coil 126 are electrically connected to the logic control circuit 132, which in turn is electrically connected to the battery 131, in a suitable manner, for example by conductive insulated wires or plated conductors. Alternatively, the optical transceiver 134 may be eliminated and data transferred between the programmable electronic key 120 and the security device 140 via magnetic induction through the inductive coil 126.

As noted above, one aspect of a programmable electronic key 120 according to the present invention, especially when used for use in conjunction with a security device 140 as described herein, is that the key does not require a physical force to be exerted by a user on the key to operate the mechanical lock mechanism of the security device. In addition, there is no required orientation of the transfer probe 125 of the programmable electronic key 120 relative to the charging port 182 of the charging station 180 or the transfer port 142 of the security device 140. Accordingly, any wear of the electrical contacts on the transfer probe 125, the charging port 182 or the transfer port 142 is minimized. As a further advantage, an authorized person is not required to position the transfer probe 125 of the programmable electronic key 120 in a particular orientation relative to the transfer port 142 of the security device 140 and thereafter exert a compressive and/or torsional force on the key to operate the mechanical lock mechanism of the device.

Figure 17B:
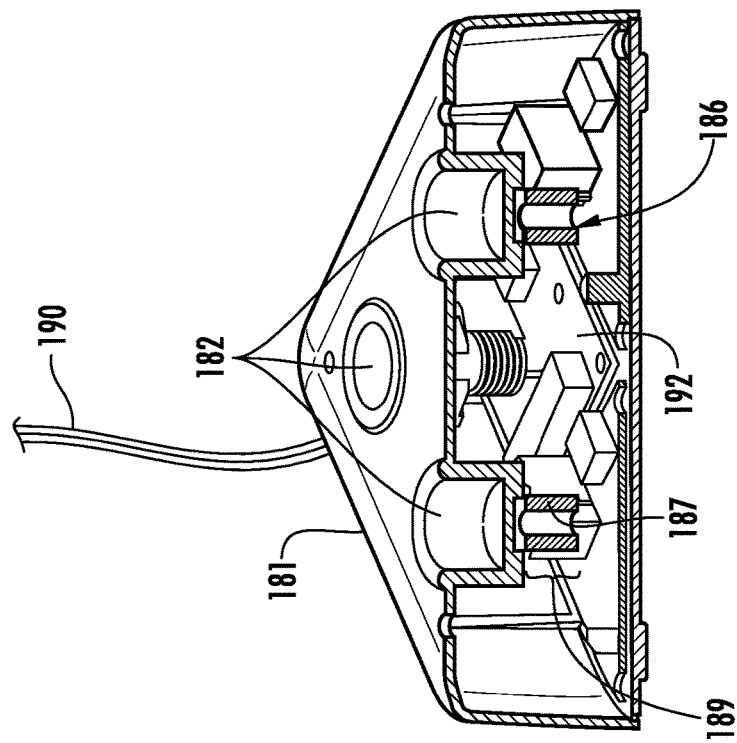
FIG. 17B is a perspective view showing a diagonal cross-section of the charging station of FIG. 17A taken along the line 17B-17B.
Figure 17A:
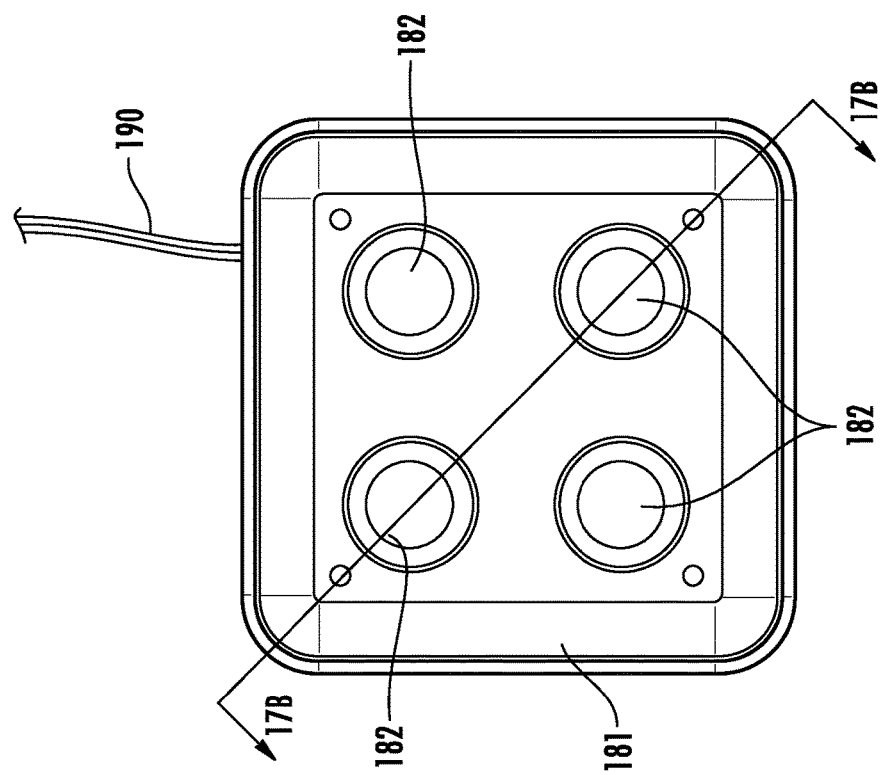
FIG. 17A is a top view showing the charging station of the system and method of FIG. 10.

FIG. 17A and FIG. 17B show charging station 180 with inductive transfer capability in greater detail. As previously mentioned, the charging station 180 recharges the internal battery 131 of the security key 120. In certain instances, the charging station 180 also deactivates the data transfer and/or power transfer capability of the key 120 until the key has been reprogrammed with the SDC by the programming station 60. Regardless, the charging station 180 comprises a housing 181 for containing the internal components of the charging station. The exterior of the housing 181 has at least one charging port 182 formed therein that are sized and shaped to receive the transfer probe 125 of a programmable electronic key 120. As previously described, mechanical or magnetic means may be provided for properly positioning and securely retaining the transfer probe 125 within the charging port 182 such that the inductive coil 126 is in alignment with a corresponding inductive coil 186 (FIG. 17B) disposed within the housing 181 of the charging station 180 adjacent the charging port. As will be readily understood and appreciated, the inductive coil 186 adjacent the charging port 182 of the charging station 180 generates, or induces, an alternating current in the conductive wire of the inductive core windings 129 of inductive coil 126 that in turn provides DC power (for example, via a bridge rectifier on the logic control circuit 132) to charge the battery 131 of the programmable electronic key 120.

As best shown in FIG. 17B, housing 181 is sized and shaped to contain a logic control circuit, or printed circuit board (PCB) 192 that is electrically connected and operatively coupled to an inductive coil 186 adjacent each of the charging ports 182. In the manner previously described with respect to inductive coil 126 and inductive coil 146, each inductive coil 186 comprises an inductive core 187 surrounded by a plurality of inductive core windings 189 formed by a conductive wire having a pair of leads (not shown). When an alternating current is passed through the conductive wire of the inductive core windings 189 with the transfer probe 125 of the programmable electronic key 120 disposed in the charging port 182 of the charging station 180, the inductive coil 186 generates a magnetic field that induces an alternating current in the conductive wire of the inductive core windings 129 of the inductive coil 126 of the key. The alternating current in the inductive coil 126 is then transformed into DC power to charge the internal battery 131 of the programmable electronic key 120. As previously mentioned, charging station 180 may comprise an internal power source, for example, an extended-life replaceable battery or a rechargeable battery, for providing power to the key(s) 120 positioned within the charging port(s) 182. Alternatively, and as shown herein, the logic control circuit 192 of the charging station 180 is electrically connected to an external power source by a power cord 190 having at least one conductor. Furthermore, logic control circuit 192 may be operable for deactivating the data transfer and/or power transfer functions of the programmable electronic key 120, or alternatively, for activating the "timing out" feature of the key until it is reprogrammed or refreshed by the programming station 60.

In some embodiments, each electronic key 20, 120 is configured to store various types of data. For example, each key 20, 120 may store a serial number of one or more security devices 40, 140, 240, 340, 440, the data and time of activation of the key, a user of the key, a serial number of the key, number of key activations, a type of activation (e.g., "naked" activation, activation transferring only data, activation transferring power, activation transferring data and power), and/or various events (e.g., a security device has been locked or unlocked). This information may be transmitted to a remote location or device (e.g., a backend computer) upon each activation of the key 20, 120 or at any other desired period of time, such as upon communication with a programming station 60. Thus, the data transfer may occur in predetermined time intervals or in real time or automatically in some embodiments. In some cases, the programming station 60 may be configured to store the data and transfer the data to a remote location or device. Authorized personnel may use this data to take various actions, such as to audit and monitor key user activity, audit security devices 40, 140, 240, 340, 440 (e.g., ensure the security devices are locked), etc. Moreover, such information may be requested and obtained on demand, such as from the programming station 60 and/or a remote device.

In other embodiments, the electronic key 20, 120 is configured to obtain data from a security device 40, 140, 240, 340, 440. For example, the security device 40, 140, 240, 340, 440 may store various data regarding past communication with a electronic key 20, 120 (e.g., key identification, time of communication, etc.), and when a subsequent electronic key communicates with the same security device, the data is transferred to the electronic key. Thus, the security device 40, 140, 240, 340, 440 may include a memory for storing such data. In some cases, the security device 40, 140, 240, 340, 440 includes a power source for receiving and storing the data, while in other cases, the power provided by the electronic key 20, 120 is used for allowing the merchandise security device to store the data. The electronic key 20, 120 may then communicate the data for collection and review, such as at a remote location or device. In some instances, communication between the electronic key 20, 120 and the programming station 60 may allow data to be pulled from the electronic key and communicated, such as to a remote location or device. In other cases, the electronic key 20, 120 may be configured to obtain data from security devices 40, 140, 240, 340, 440, such as an identification of the security device, identification of the items contained within or by the security device, and/or the system health of the security device and/or the items. The electronic key 20, 120 may store the data and provide the data directly to a remote location or device or upon communication with the programming station 60. As such, the electronic keys 20, 120 may be a useful resource for obtaining various types of data from the merchandise security devices 40, 140, 240, 340, 440 without the need for wired connections or complex wireless networks or systems. In other embodiments, the security devices 40, 140, 240, 340, 440 themselves may include wireless communication capability to allow for transmission of the data to a remote device or location.

In another embodiment, each electronic key 20, 120 may include a security code and a serial number for one or more security devices 40, 140, 240, 340, 440. For example, a key 20, 120 may only be able to lock or unlock a security device 40, 140, 240, 340, 440 where the security codes and the serial numbers match one another. In one example, each serial number is unique to a security device 40, 140, 240, 340, 440 and could be programmed at the time of manufacture or by the retailer. Individual electronic keys 20, 120 may then be assigned particular serial numbers for authorized security devices 40, 140, 240, 340, 440 (e.g., user 1 includes serial numbers 1, 2, 3; user 2 includes serial numbers 1, 4, 5). Each of the electronic keys 20, 120 may be programmed with the same security code using a programming station 60. In order to lock or unlock a merchandise security device 40, 140, 240, 340, 440, the electronic key 20, 120 may communicate with a particular security device and determine whether the security codes and the serial numbers match. If the codes match, the electronic key 20, 120 then locks or unlocks the security device 40, 140, 240, 340, 440.

Figure 18:
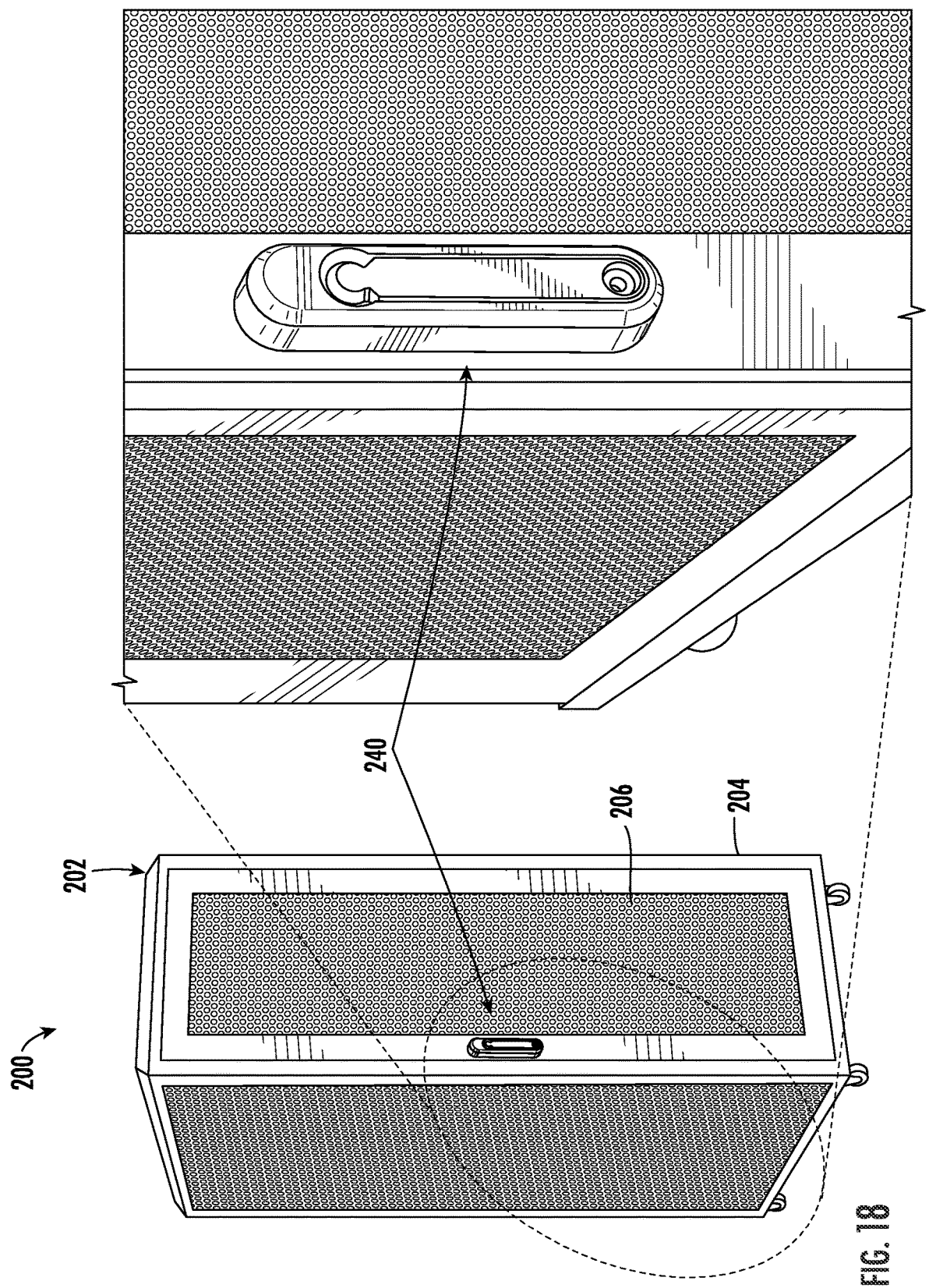
FIG. 18 illustrates a system comprising a server rack and a lock according to an embodiment of the invention.
Figure 19:
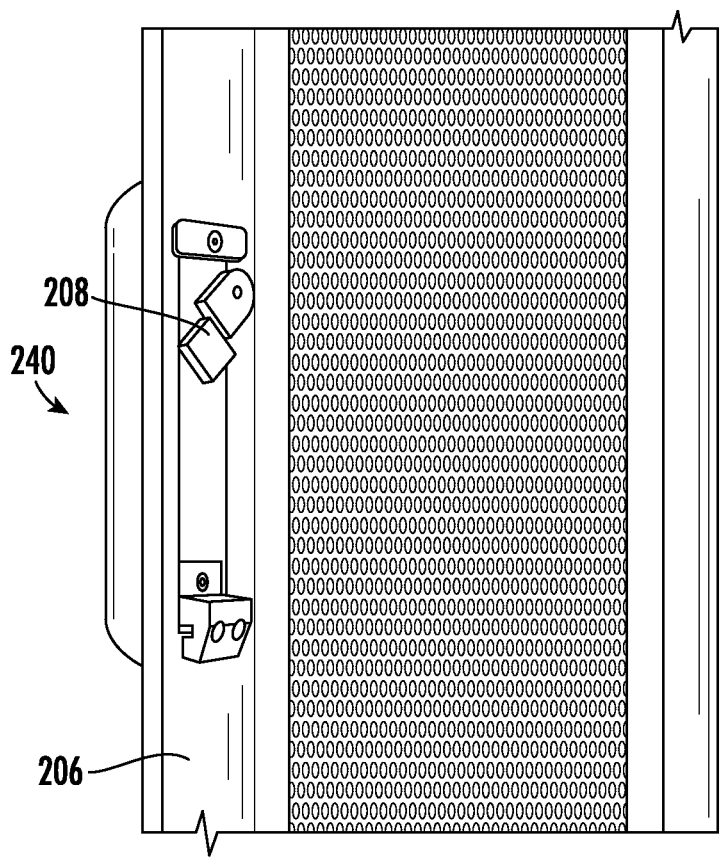
FIG. 19 is rear perspective view of the server rack and the lock of FIG. 19.

According to another embodiment, FIG. 18 illustrates a system 200 comprising a server rack 202 and a lock 240. In this example, the server rack 202 includes a cabinet 204 and a door 206 pivotably attached to the cabinet, although other types of server racks may be used. The lock 240 is configured to lock the door 206 to the cabinet 204 such that the door is incapable of being opened when the lock is locked but is able to be opened when the lock is unlocked. FIG. 19 illustrates that in this embodiment, the lock 240 includes a latch 208 that is configured to engage the cabinet 204 to prevent the door 206 from opening when locked. The latch 208 may be any suitable mechanism configured to move between an engaged position with the cabinet 204 and a disengaged position whereby the latch is no longer in engagement with the cabinet.

In some embodiments, the lock 240 is configured to operate according to the various embodiment discussed above for the security devices 40, 140. For example, the lock 240 may be an electronic lock configured to be controlled by a key 20, 120 using power and/or data communication using various communication protocols. In the illustrated embodiment, the lock 240 may include a transfer port 242 that is configured to facilitate communication with a key 20, 120 as disclosed above (see, e.g., FIG. 23). In other embodiments, the lock 240 may be configured to be operated using a combination of electrical and mechanical interaction. For example, an electronic key 20, 120 may be used to indicate whether the operator is authorized to unlock the lock 240 and perform a first unlock operation, and the operator may be required to perform a second mechanical operation to disengage the latch 208 to allow the door 206 to be opened. Thus, in some embodiments, a two-step unlocking operation is required to unlock the lock 240. In some cases, the lock 240 includes a handle 210, and the operator of the lock may be required to move a handle to the unlocked position to unlock the door, such as by rotating the handle in a clockwise or counter-clockwise direction (see, e.g., FIGS. 22-23). It is understood that the use of the term "handle" is not intended to be limiting, as any suitable actuator may be used to allow a mechanical disengagement of the lock 240 to allow the door 206 to be opened.

Figure 20:
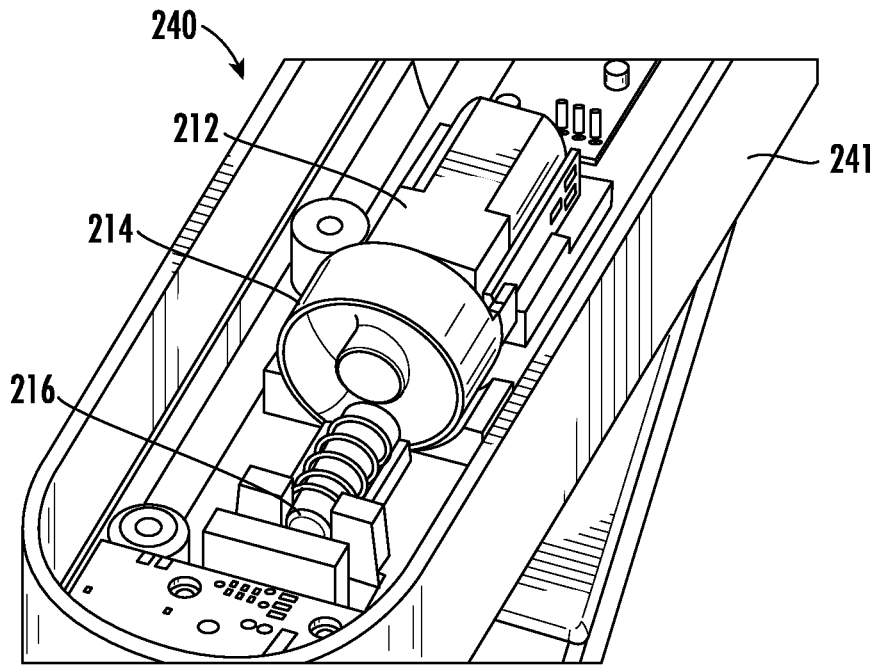
FIGS. 20 and 21 illustrate a partial perspective view of an electronic lock in a locked state and an unlocked state according to an embodiment of the invention.
Figure 21:
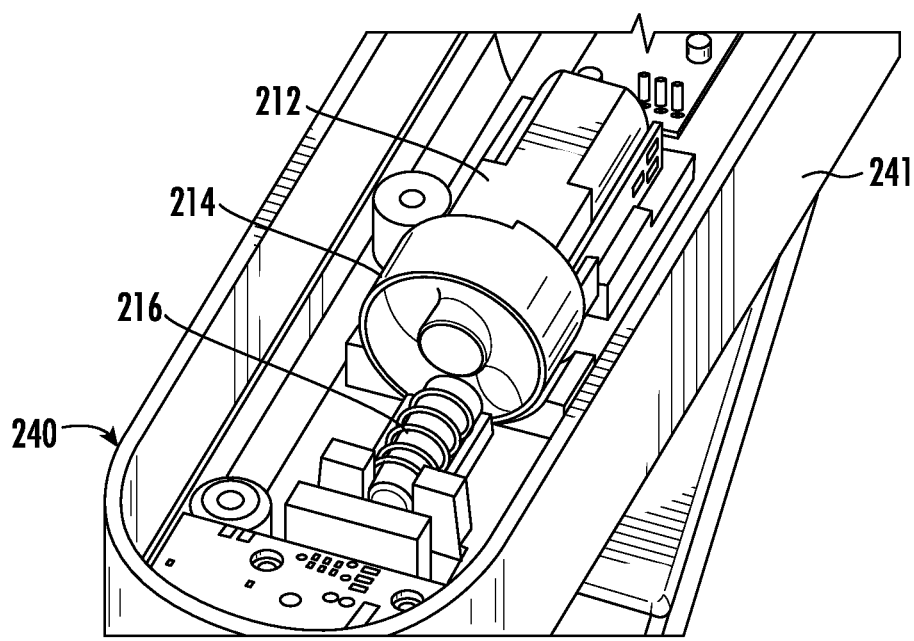

FIGS. 20-21 illustrate an example embodiment of an electronic lock 240 that is configured to release the handle 210 for allowing an operator to unlock the lock (a portion of the electronic lock has been removed for purposes of illustration). The electronic lock 240 may include a housing 241 that houses a variety of components as disclosed herein. In this embodiment, the lock 240 includes a mechanism configured to covert rotational movement into linear movement for releasing the handle 210. In this regard, the lock 240 may include a motor 212 that is configured to rotate an actuator 214 (e.g., a cam) that is in engagement with a pin 216. In this example, the motor 212 and the pin 216 are arranged in-line with one another or along the same axis. Rotation of the actuator 214 causes the pin 216 to move between an engaged position with the handle 210 (e.g., FIG. 20) and a disengaged position with the handle (e.g., FIG. 21). The pin 216 may be spring loaded in some cases to facilitate engagement and disengagement with the handle 210 as the actuator 214 rotates. The motor 212 may be operated using power transferred from a key 20, 120, as described above, or could include its own power source in other embodiments. The lock 240 could also include a power storage device (e.g., one or more capacitors) for storing power transmitted by the key 20, 120 for performing one or more functions, such as operation of the motor 212.

Figure 28:
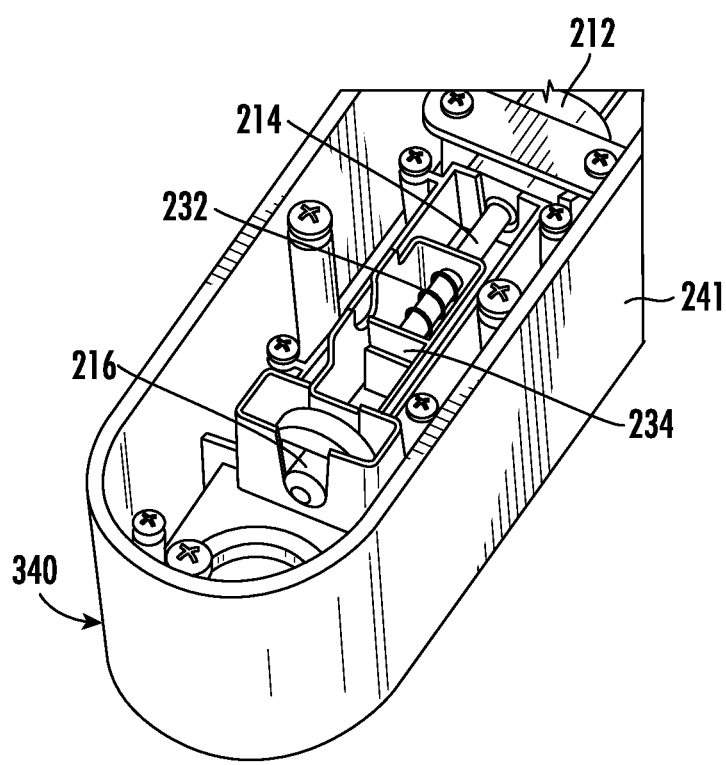
FIG. 28 illustrates a partial perspective view of an electronic lock according to an embodiment of the invention.
Figure 29:
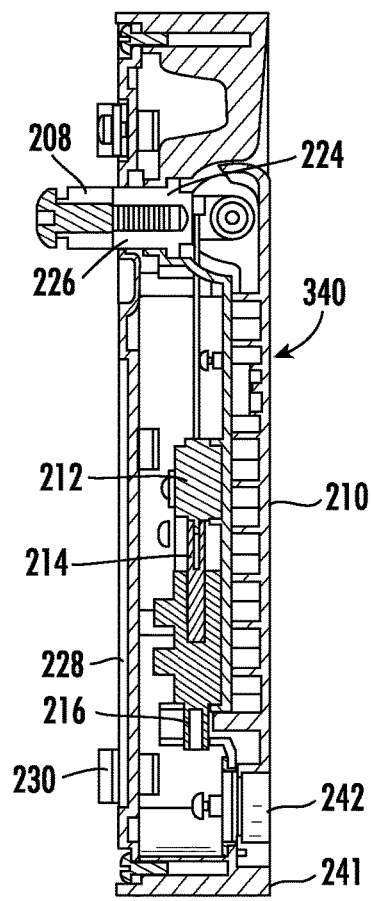
FIG. 29 illustrates a side cross-sectional view of the electronic lock shown in FIG. 28 with the handle in an engaged position.

It is understood that a variety of mechanisms may be used for the electronic lock 240 to facilitate engagement and disengagement of the handle 210. For example, FIGS. 28 and 29 show an alternative embodiment of an electronic lock 340 that employs a motor 212 configured to rotate an actuator 214. Rotation of the motor 212 causes the actuator 214 to rotate between a position where the pin 216 is biased to an engaged position with the handle 210 or to a retracted position whereby the handle is released based on loading and unloading of a spring 232, which in turn causes a shuttle 234 to move linearly. As before, the motor 212 and the pin 216 may be arranged in-line with one another or along the same axis and convert rotational to linear movement.

Figure 30:
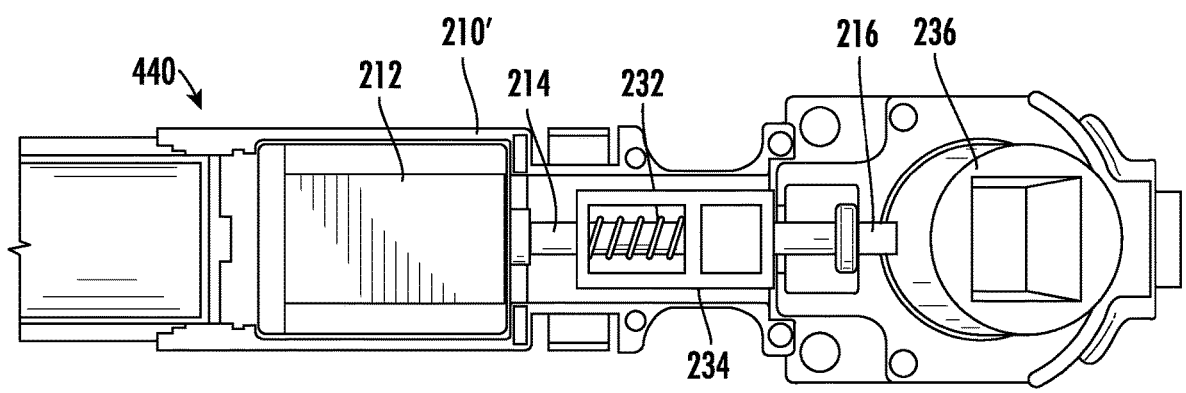
FIG. 30 illustrates a partial perspective view of an electronic lock in a locked state according to an embodiment of the invention.
Figure 31:
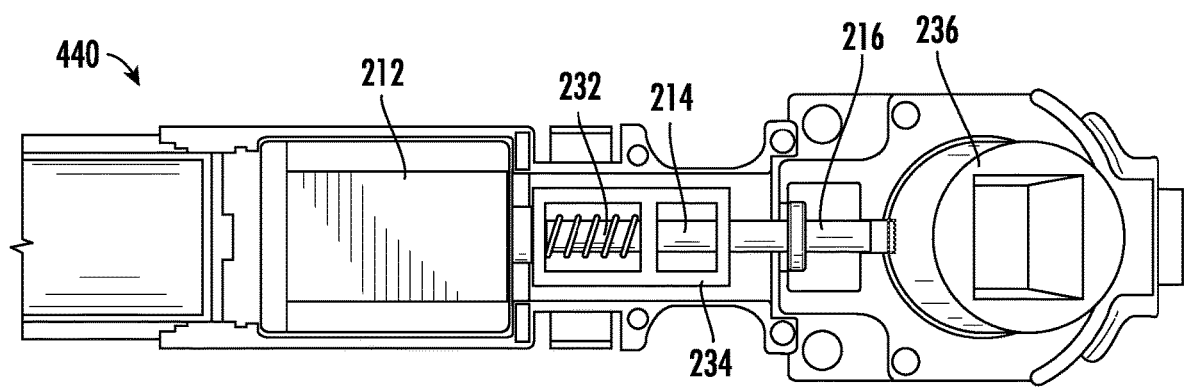
FIG. 31 illustrates the lock of FIG. 30 in an unlocked state.

FIGS. 30 and 31 illustrate a lock mechanism 440 according to another embodiment, which is similar to that described above with respect to FIG. 28 but demonstrates that different types and configurations of lock mechanisms and handles may be employed. In this embodiment, a motor 212 is configured to rotate an actuator 214 for loading or unloading a spring 232 that is engaged with the actuator and a shuttle 234. Unloading of the spring 232 causes the shuttle 234 to move the pin 216 to an extended position for engaging a latch mechanism 236 to allow rotation of a drive shaft 224 (see, e.g., FIG. 30 where the pin engages a slot defined in the latch mechanism) while loading the spring causes the shuttle to move to a retracted position and out of engagement with the latch mechanism (see, e.g., FIG. 31), although it is understood that loading or unloading could be used for either extending or retracting the pin based on the direction of rotation of the actuator 214. In this example, the handle 210' is configured to rotate when the pin 216 is in an extended and engaged position with the latch mechanism 236 for actuating a latch to an unlocked and disengaged position. When the pin 216 is retracted, rotation of the handle 210' will not actuate the latch and will not disengage the door. One advantage of this embodiment is that the spring 232 is configured to store energy to be used to ensure that the lock 240 is in the locked or unlocked position as intended. In this way, if the pin 216 is actuated to an extended position but fails to engage the latch mechanism 236 (e.g., due to the handle 210' being rotated prior to communicating with a key 20, 120 and actuation of the pin) the spring 232 will store energy and cause the pin to engage the latch mechanism once the handle is rotated back to its initial unlocked position (e.g., so that the pin engages the slot defined in the latch mechanism). In a similar fashion, if one were to attempt to actuate the handle 210' prior to communicating with a key 20, 120, the pin 216 may not retract due to the force being applied between the latch mechanism 236 and the pin; however, once the force is released from the handle, the stored energy in the spring 232 will cause the pin to automatically disengage the latch mechanism. Thus, the lock mechanism 440 in this particular embodiment is configured to store sufficient energy to actuate the lock mechanism without using additional electrical power or a battery.

Figure 22:
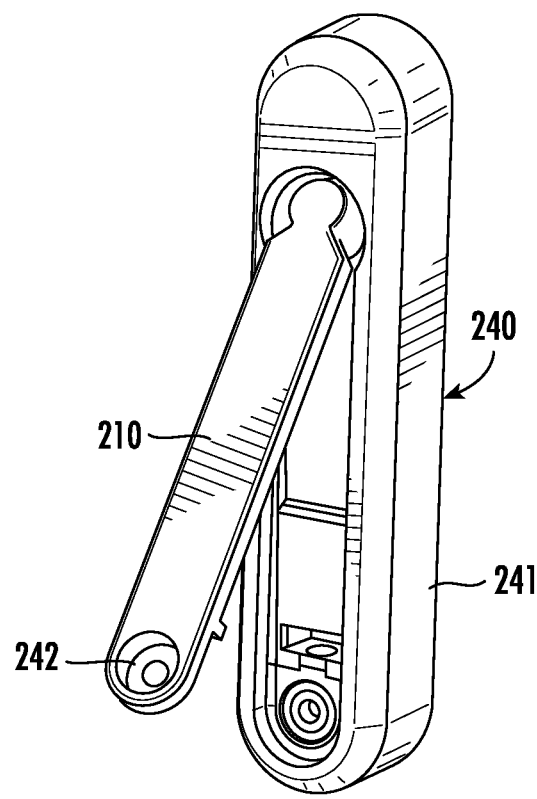
FIGS. 22 and 23 illustrate an electronic lock and a handle in a disengaged position and an engaged position, respectively, according to an embodiment of the invention.
Figure 23:
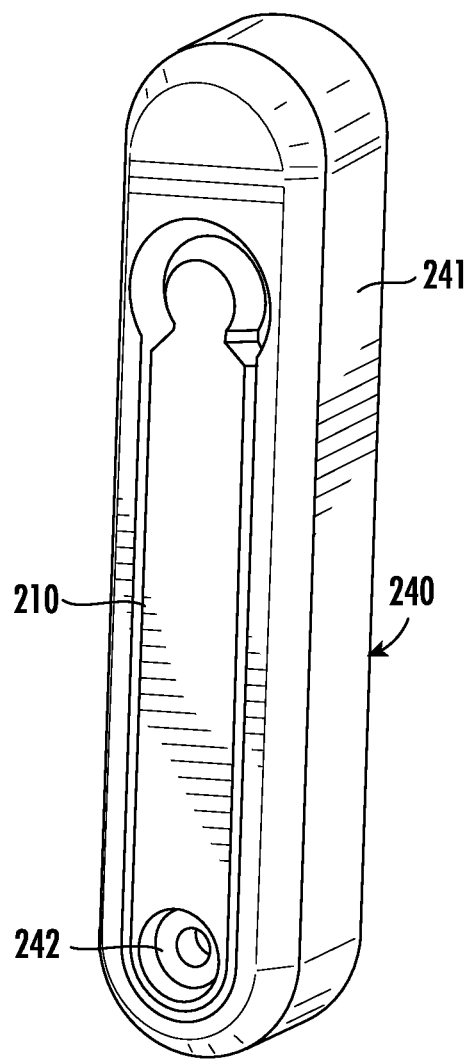
Figure 24:
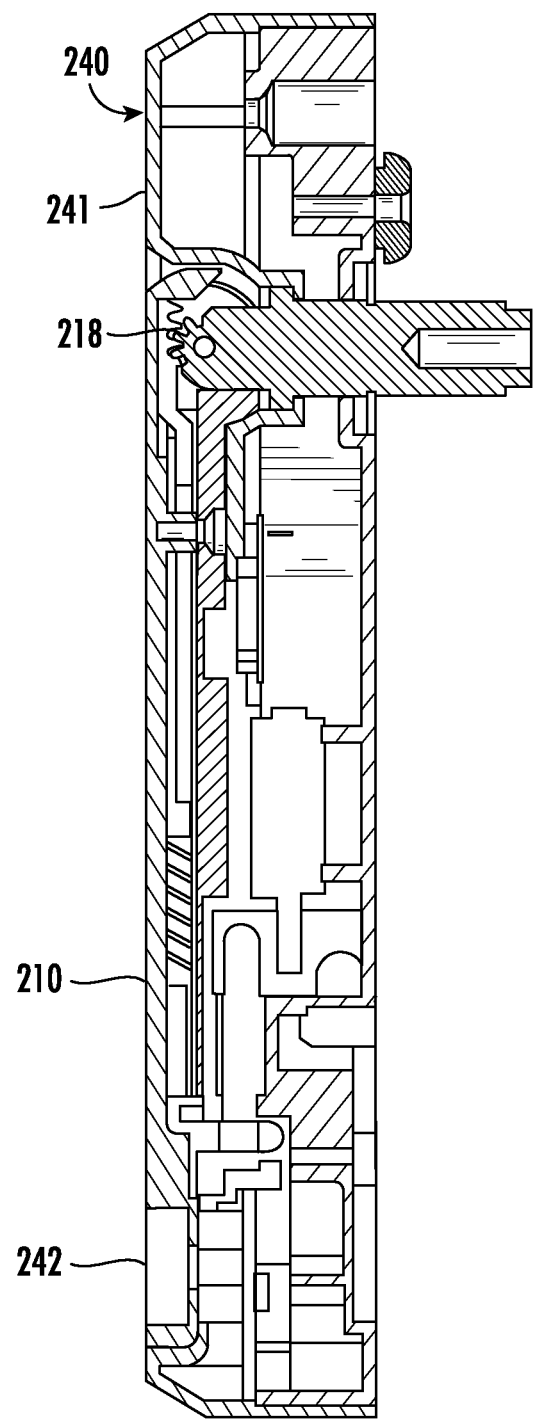
FIGS. 24-27 illustrate side cross-sectional views of an electronic lock with the handle being in a disengaged position and an engaged position according to embodiments of the invention.
Figure 25:
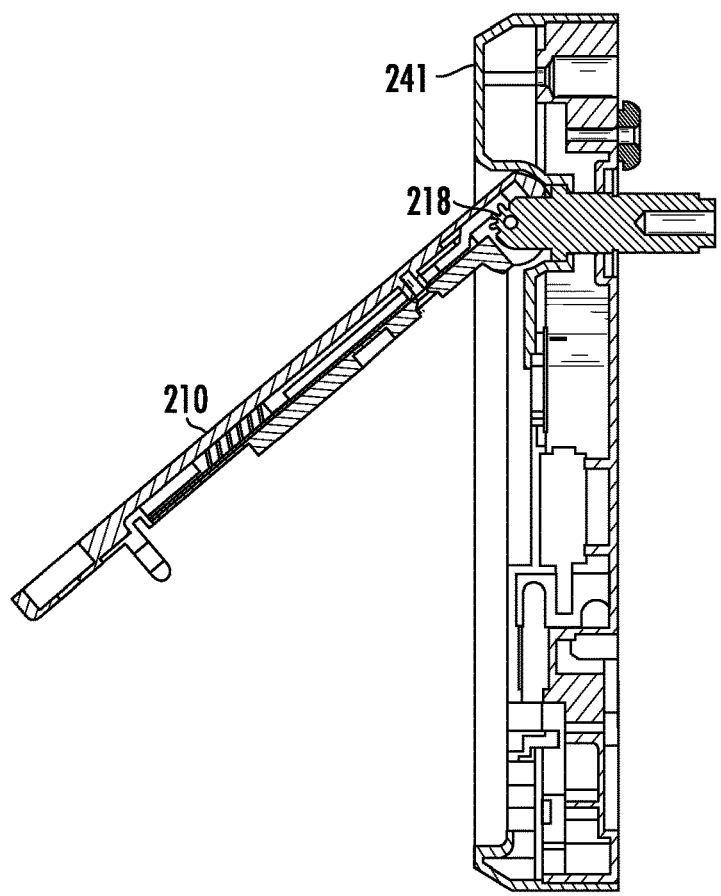
Figure 26:
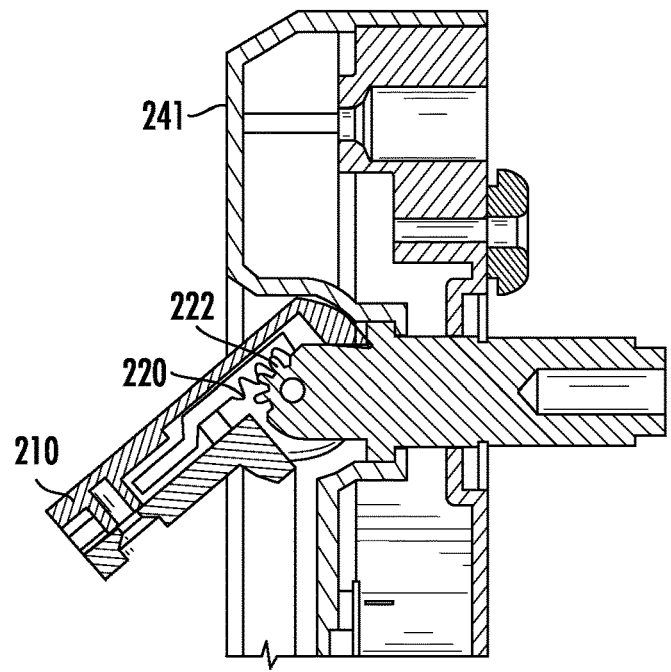
Figure 27:
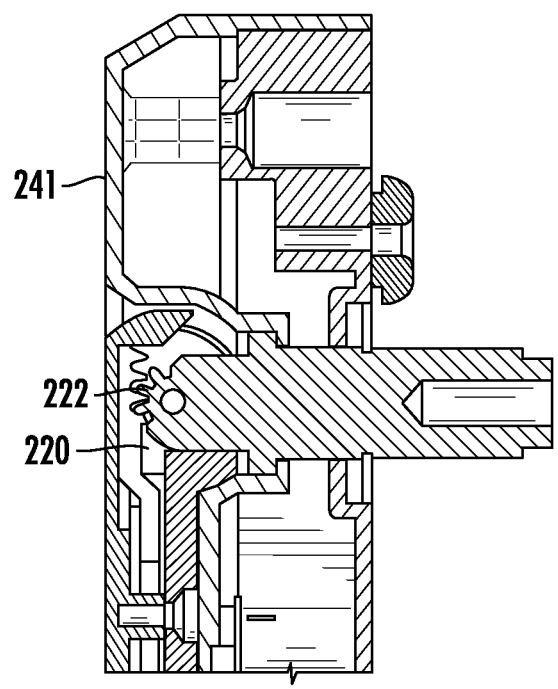

In some embodiments, the handle 210 is configured to move between an engaged position (e.g., FIG. 23) and a disengaged position (e.g., FIG. 22). As shown in FIG. 22, in the disengaged position, the handle 210 extends outwardly from the housing 241 of the lock 240. In this way, the operator is able to readily determine that the lock 240 is unlocked, as well as allow the operator to actuate the handle 210 between locked and unlocked positions. For example, the handle 210 may be configured to pivot about one end such that the operator may be able to rotate the handle 210 clockwise or counter-clockwise between locked and unlocked position when the handle has been disengaged with the housing of the lock 240. In some advantageous embodiments, the handle 210 is configured to automatically disengage and extend from the housing of the lock 240 in response to unlocking of the lock mechanism (e.g., in response to communication with an authorized key 20, 120 as discussed above). For instance, FIGS. 25-27 show an embodiment wherein the lock 240 further includes a rack and pinion mechanism 218 that is configured to cause the handle 210 to pivot about one end to a position extending outwardly from the housing of the lock 240. In operation, disengagement of the pin 216 causes a rack 220 engaged with the handle 210 to travel along the pinion gear 222. A spring or the like could be employed to cause the rack 220 to move in response to disengagement of the pin 216. The pinion gear 222 is fixed in position such that movement of the rack 220 along the pinion gear causes the handle 210 to rotate outwardly (e.g. compare FIGS. 26 and 27). In one example, the opposite end of the pinion gear 222 may be configured to be attached to the latch 208 such that rotation of the handle 210 rotates the latch. Other mechanisms could be employed to cause the handle 210 to move to a disengaged position, such as one or more springs and/or magnets configured to bias the handle outwardly from the housing of the lock 240, 340, 440.

In some embodiments, techniques for ensuring that the door 206 is closed prior to locking the lock 240, 340, 440 and/or ensuring that the lock is locked are provided. In this regard, embodiments may prevent "air locks", which is the instance where the lock 240, 340, 440 has been locked, but the door 206 and/or the handle 210 is not actually closed. For example, one or more sensors may be provided for detecting if the door 206 is indeed closed and/or the handle 210 is indeed in the correct position before allowing the lock 240, 340, 440 to be activated. Various mechanisms could be used for such detection, such as for example, electronic switches, magnetic detectors, capacitive detectors, light detectors, LED emitters, resistance level detectors, reed switches, optical switches, unique identifiers, and others. In some cases, when the door 206 is closed and the handle 210 is closed, an electrical circuit is completed that then permits the lock 240, 340, 440 to be locked. In other words, the lock 240, 340, 440 is only able to be locked when the electrical circuit is complete.

In some embodiments, mechanisms may be provided for anti-spoofing protection to protect against unauthorized opening of the lock 240, 340, 440. For instance, the lock 240, 340, 440 may employ "smart" detectors such as, for example, detectors configured to detect an expected signal from a key 20, 120. In some examples, the detectors could be configured to detect a UPC or QR code or a specific pulsing light or magnetic signals with a code. Such a smart detector could also be configured to determine if tampering of the lock 240, 340, 440 had taken place. For example, a plunger switch could detect if the detector had been removed from the lock 240, 340, 440 and then provide a notification signal to the lock. In another embodiment, the detector and the lock 240, 340, 440 are configured to be paired, so that if an incorrect match is discovered, an alert is generated. Finally, the detector may be configured to read or detect a particular characteristic, such as a magnetic field strength, such that any tampering may change the characteristic and thus indicate a breach had been attempted.

In some embodiments, the lock 240, 340, 440 may be configured to provide a final acknowledgement to the key 20, 120 that it successfully locked. However, if the user pulls the key 20, 120 away from the lock 240, 340, 440 too fast, the acknowledgment may be lost. One example technique to address this problem is provide a lock 240, 340, 440 with a power storage device (e.g., a capacitor) that is configured to store sufficient energy to re-open the lock. In other words, when the lock 240, 340, 440 locks, the lock provides its acknowledgment and then waits for the key 20, 120 to respond that the acknowledgment was received. If the lock 240, 340, 440 does not receive confirmation from the key 20, 120, the lock then unlocks. Thus, the lock 240, 340, 440 will only remain locked if a confirmation is received from the key 20, 120.

As discussed above, the handle 210 may be configured to automatically lift from the housing of the lock 240, 340, 440 when the lock is unlocked. This creates a visual indicator that the handle 210 is not locked. This does not open the door 206, as the handle 210 has only been moved from its "ready-to-lock" position to its "ready-to-turn" position automatically. In addition, in this embodiment, the location for locking is on the handle 210 (see, e.g., transfer port 242). In this way, the handle 210 must be in the closed position before the key 20, 120 is able to communicate with the lock 240, 340, 440. This creates a visual indicator to the operator that the handle 210 must be closed and may also allow one-hand functionality as the key 20, 120 may itself hold the handle down while locking the lock 240, 340, 440.

In some embodiments, such as for example, those discussed above, a key 20, 120 may be authorized by a programming station 60. In some cases, a pin code or other authorization is required to order to authorize a key 20, 120. In some server rack facilities, authentication is required just to get into the building storing the racks. Often this is carried out using access cards and/or biometrics. Thus, in some embodiments, the authentication process may be streamlined by using one of the existing methods already implemented in the server rack facility. For example, the existing authentication system may be configured to deliver an authentication signal to the programming station 60 rather than having a user input a separate pin code to indicate that the user is authorized to use the key 20, 120. Thus, the programming station 60 may be configured to receive a signal from the local authentication system of the server rack facility. This signal could be delivered using various communication protocols so as to tie the authentication of the user gaining access to the server rack facility to the key 20, 120 he or she is authenticating. Another embodiment of key authentication is the ability for the system to limit the amount of locks 240, 340, 440 a key 20, 120 is allowed to access. For example, a user might be given a *single* key press to open *one* lock 240, 340, 440 and then must return to the programming station 60 to open other locks. Alternately, the reverse could also be programmed such that a given lock 240, 340, 440 is only allowed to be opened X times per day and after that, no access is permitted.

Many server racks have different types of mechanical locks from a simple cam, to double throw rods, to sliding multi-latch plates and others. Also, doors 206 have different holes and openings for the lock to attach to. Thus, utilizing a one-size-fits-all lock may be difficult to achieve using the existing footprint of the lock. In some embodiments, mounting features on the lock 240, 340, 440 can solve these problems. For example, as shown in FIG. 29, the drive shaft 224 of the lock 340 that is in engagement with the handle 210 may be flush with the back of the lock and include a keyed socket and/or tapped screw hole 226 or other like attachment point. This configuration allows any variety of adapters and/or latches 208 to be attached to the drive shaft 224 to accommodate different latches and locking mechanisms. Another feature may be a recessed channel 228 that is defined on the back housing of the lock 340 having a variety of attachment mounting points 230 (e.g., fasteners). Thus, various components, such as hooks or plates, can be customized to attach to these attachment points 230 within the recessed channel 228 to adapt the housing of the lock 340 to be attached to any door configuration without causing the dimensions of the lock to change significantly to thereby ensure compatibility with the existing footprint of the lock.

In some embodiments, the lock 240, 340, 440 may include a digital display either integrated into, or a module attached to, the lock. This display could have several features such as indicating to the user whether he or she is authorized to open the lock 240, 340, 440. The display may also display a status state (e.g., locked or unlocked), which may be beneficial for ensuring that the racks are secure (e.g., to a security person walking the floor of the server facility to check the status of the locks). The display could indicate various other types of information such as, for example, whether or not the lock 240, 340, 440 and door 206 are closed, whether there have been any tamper attempts, and identification of those who accessed that server rack. Maintenance information could also be delivered to the display, such as for technicians working on components in the rack (e.g., for determining which drive is to be replaced).

In some embodiments, various alerts may be provided, such as for detecting concerning situations. Alerts could be audible/visual locally or delivery of a message to an appropriate person or remote device to investigate. Some types of alerts would be tamper attempts or doors not being locked after a certain time limit. More advanced alerts could be implemented as well. For example, if there were standard maintenance times entered into the system (e.g., 20 minutes to remove a drive from a server rack), the system could match the work order to the lock 240, 340, 440 opening and then monitor for an aberration of the standard time and then send an alert. Also, technicians could be monitored to see when they are opening racks 240, 340, 440. A long delay between two lock 240, 340, 440 openings could indicate an employee taking unauthorized breaks on the job or possibly having time to do something nefarious.

In other embodiments, the key 20, 120 may be used for ensuring chain of custody. For example, the key 20, 120 may be configured to scan the rack or hardware contained within the rack (e.g., servers or hard drives). For example, each drive could have an NFC label attached thereto (or any other of a number of devices to be identified), and the key 20, 120 may be configured to read data on the NFC label. Scanning the NFC label may result in the key 20, 120 storing information stored on the label which may in turn be stored in the key for auditing purposes. When the technician opens the door 206, they may also be required to scan the drive they are removing, which could likewise be stored on the key 20, 120. In the event the server drives are to be destroyed, the key 20, 120 may also be configured to scan the drives at the destruction point for storing additional audit data. Thus, the key 20, 120 can facilitate acquiring more data about when and who accessed a drive, leading to a chain of custody for that drive.

In additional embodiments, the system 200 may include a security device to detect unauthorized access to a server rack 202. In one example, the security device may be configured to detect removal of a drive contained within the server rack 202. For instance, each drive could have a security device attached to it and then attached to the rack that acts as a "fuse" and if the drive is removed, the fuse is blown. This information can then be delivered to the key 20, 120 or the lock 240, 340, 440 through wired or wireless means. The system 202 may be configured to determine if this was a legitimate removal (e.g., a technician authorized to replace the drive) or an unauthorized removal resulting in sending an alert. Many different techniques could be developed for detecting removal of any component from the server rack, such as for example, a plunger switch, a tether, magnetic sensing, and/or light-based sensing. With respect to fuses, the fuses could also have a detachable mechanism to allow removal without triggering a security event. For example, the same key 20, 120 that opens the lock 240, 340, 440 could be configured to disable the fuse. The data about fuse disablement may also be stored in the key 20, 120. Alternately, only certain fuses may be allowed to be disabled by the key 20, 120 based on the given user and/or the work order. Also, a fuse plugged into a drive (e.g., a cat-5 port) may be configured to deliver an electronic signal to that drive when an unauthorized removal happens—such a signal might be communicated to the drive to erase itself. An unauthorized fuse signal or an unauthorized lock 240, 340, 440 opening could also result in sending a signal back to a remote system (e.g., with the key 20, 120) to initiate a lock-down whereby no locks 240, 340, 440 are allowed to be opened until an override is provided (e.g., by a site manager).

In some embodiments, forced break-ins are sometimes necessary such as when the electronics in the lock 240, 340, 440 fails or the lock is mechanically jammed Thus, it may be desirable to include means for differentiating between an authorized break-in due to lock failure and an unauthorized break in. One method of providing such differentiation is to design the lock 240, 340, 440 in such a way as to make a break-in attempt obvious. For instance, intentional designs such as thin walls, material selection, or break points could cause the lock 240, 340, 440 to fail in such a way that is visually obvious and difficult to cover up. In other examples, notifications could be provided to alert that a forced break-in was attempted. For example, vibration or pressure sensors could be included on the lock 240, 340, 440 that are configured to detect anomalous vibrations or pressure and could then send an alert in response to such detection. A number of different sensor types known in the art could accomplish this goal.

The foregoing has described several embodiments of systems, devices, locks, keys, computer storage mediums, and methods. Although embodiments of the present invention have been shown and described, it will be apparent to those skilled in the art that various modifications thereto can be made without departing from the spirit and scope of the invention. Accordingly, the foregoing description is provided for the purpose of illustration only, and not for the purpose of limitation.

That which is claimed is:

1. A security system for a server rack comprising:
an electronic key; and
an electronic lock configured to be attached to the server rack, the electronic lock configured to communicate with the electronic key for determining whether the electronic key is authorized to unlock or lock the electronic lock,
wherein the electronic lock comprises a handle configured to be disengaged from the electronic lock when the electronic key is authorized,
wherein the electronic key comprises an internal power source, and wherein the electronic lock is configured to be operated using electrical power transferred from the internal power source,
wherein the electronic key is only capable of communicating with the electronic lock when the handle is engaged with the electronic lock.

2. The security system of claim 1, wherein the handle is configured to be actuated for accessing the server rack when the handle is disengaged from the electronic lock, and wherein the electronic lock is configured to re-lock only when the handle is engaged with the electronic lock.

3. The security system of claim 1, wherein the electronic lock is configured to detect engagement of the handle with the electronic lock.

4. The security system of claim 1, wherein the handle is configured to be rotated between a latched position and an unlatched position.

5. The security system of claim 1, wherein the handle is configured to automatically disengage the electronic lock when the electronic key is authorized.

6. The security system of claim 1, further comprising a programming station for authorizing the programmable electronic key.

7. The security system of claim 4, wherein the handle is configured to pivot about one end between the latched and unlatched positions.

8. The security system of claim 1, wherein the electronic lock comprises a mechanism configured to covert rotational movement into linear movement for releasing the handle.

9. The security system of claim 1, wherein the electronic key is configured to communicate with the electronic lock for re-locking the electronic lock.

10. The security system of claim 9, wherein the electronic lock is configured to remain re-locked only if a confirmation is received from the electronic key.

11. The security system of claim 1, wherein the electronic key is configured to obtain identification and/or audit data from the electronic lock.

12. The security system of claim 1, wherein the electronic key is configured to store identification and/or audit data based on interaction with the electronic lock.

13. The security system of claim 1, further comprising a plurality of electronic locks, and wherein the electronic key is configured to be authorized for unlocking the plurality of electronic locks.

14. The security system of claim 13, further comprising a plurality of electronic keys, wherein each of the plurality of electronic keys is configured to be authorized for unlocking different electronic locks.

15. The security system of claim 1, wherein the electronic key is configured to be authorized if a security code stored by the electronic key matches a security code stored by the electronic lock.

16. A security system for a server rack comprising:
an electronic key;
an electronic lock configured to be attached to the server rack, the electronic lock configured to communicate with the electronic key for determining whether the electronic key is authorized to unlock or lock the electronic lock; and
a latch mechanism operably engaged with the electronic lock and configured to move between a latched position and an unlatched position when the electronic lock is unlocked,
wherein the electronic lock comprises a handle configured to be disengaged from the electronic lock when the electronic key is authorized, wherein the handle is configured to actuate the latch mechanism for accessing the server rack when the handle is disengaged from the electronic lock and the electronic lock is unlocked, and wherein the electronic lock is configured to re-lock only when the handle is engaged with the electronic lock.

17. The security system of claim 16, wherein the electronic key comprises an internal power source, and wherein the electronic lock is configured to be operated using electrical power transferred from the internal power source to the security device.

18. A method for protecting a server rack from unauthorized access, the method comprising:

communicating between an electronic key and an electronic lock to determine whether the electronic key is authorized to unlock or lock the electronic lock, wherein the electronic lock comprises a handle configured to be disengaged from the electronic lock when the electronic key is authorized, wherein the electronic key is only capable of communicating with the electronic lock when the handle is engaged with the electronic lock; and transferring electrical power from the internal power source of the electronic key to the security device, wherein the electronic lock is configured to be operated using electrical power transferred from the internal power source if the electronic key is authorized.

19. The method of claim 18, wherein the electronic lock comprises a handle, and wherein the method further comprises disengaging the handle from the electronic lock when the electronic key is authorized for unlocking the electronic lock and re-locking the electronic lock only when the handle is re-engaged with the electronic lock.

* * * * *